United States Patent
Cook et al.

(10) Patent No.: US 7,475,000 B2
(45) Date of Patent: Jan. 6, 2009

(54) APPARATUS AND METHOD FOR MANAGING INTEGRATED CIRCUIT DESIGNS

(75) Inventors: Stephen Cook, Knebworth (GB); Simon Broadley, Aylesbury (GB); Mark Bilton, London (GB); Mark Farr, Watford (GB); Ben Wimpory, Swansea (GB); Lee Hewitt, Chesham (GB); Tim Glover, Birmingham (GB)

(73) Assignee: ARC International, PLC, Elstree Herts (GB)

( * ) Notice: Subject to any disclaimer, the term of this patent is extended or adjusted under 35 U.S.C. 154(b) by 749 days.

(21) Appl. No.: 10/423,745

(22) Filed: Apr. 25, 2003

(65) Prior Publication Data

US 2003/0229482 A1 Dec. 11, 2003

Related U.S. Application Data

(60) Provisional application No. 60/375,997, filed on Apr. 25, 2002.

(51) Int. Cl.
*G06F 17/50* (2006.01)
*G06F 9/44* (2006.01)

(52) U.S. Cl. .............................. 703/14; 703/13; 703/21; 716/1

(58) Field of Classification Search ................ 703/1, 703/13, 14, 21; 716/1
See application file for complete search history.

(56) References Cited

U.S. PATENT DOCUMENTS

| | | | |
|---|---|---|---|
| 4,831,543 A * | 5/1989 | Mastellone | 716/2 |
| 5,361,373 A | 11/1994 | Gilson | |
| 5,404,319 A | 4/1995 | Smith et al. | |
| 5,450,586 A | 9/1995 | Kuzara et al. | |
| 5,491,640 A | 2/1996 | Sharma | |
| 5,493,508 A | 2/1996 | Dangelo et al. | |
| 5,502,661 A | 3/1996 | Glunz | |
| 5,519,630 A | 5/1996 | Nishiyama et al. | |

(Continued)

FOREIGN PATENT DOCUMENTS

GB 2 308 470 6/1997

(Continued)

OTHER PUBLICATIONS

Wolfgang Nebel, Guido Schumacher, "Object-Oriented Hardware Modeling—Where to apply and what are the objects" IEEE 1996, 0-89791-848-7/96, 6 pages.*

(Continued)

*Primary Examiner*—Paul L Rodriguez
*Assistant Examiner*—Dwin M Craig
(74) *Attorney, Agent, or Firm*—Ropes & Gray LLP

(57) ABSTRACT

Apparatus and methods for integrated circuit (IC) design, including management of the configuration, design parameters, and functionality of a design in which custom instructions or other design elements may be controlled by the designer. In one exemplary embodiment, a computer program rendered in an object-oriented language implementing the aforementioned methods for designing user-customized digital processors is disclosed. Design iteration, component encapsulation, use of human-readable file formats, extensible dynamic GUIs and tool sets, and other features are employed to enhance the functionality and accessibility of the program. Components within the design environment comprise encapsulated objects which contain information relating to interfaces with other components in the design, hierarchy, and other facets of the design process.

5 Claims, 27 Drawing Sheets

U.S. PATENT DOCUMENTS

| | | | |
|---|---|---|---|
| 5,535,331 A | 7/1996 | Swoboda et al. | |
| 5,537,580 A | 7/1996 | Giomi et al. | |
| 5,544,067 A | 8/1996 | Rostoker et al. | |
| 5,555,201 A | 9/1996 | Dangelo et al. | |
| 5,590,049 A | 12/1996 | Arora | |
| 5,696,956 A | 12/1997 | Razdan et al. | |
| 5,732,192 A | 3/1998 | Malin et al. | |
| 5,748,875 A | 5/1998 | Tzori | |
| 5,763,907 A * | 6/1998 | Dallavalle et al. | 257/202 |
| 5,801,958 A | 9/1998 | Dangelo et al. | |
| 5,812,130 A | 9/1998 | Van Huben et al. | |
| 5,812,416 A | 9/1998 | Gupte et al. | |
| 5,819,050 A | 10/1998 | Boehling et al. | |
| 5,819,064 A | 10/1998 | Razdan et al. | |
| 5,841,663 A | 11/1998 | Sharma | |
| 5,850,554 A * | 12/1998 | Carver | 717/162 |
| 5,854,929 A | 12/1998 | Van Praet et al. | |
| 5,854,930 A | 12/1998 | McLain et al. | |
| 5,867,399 A | 2/1999 | Rostoker et al. | |
| 5,867,400 A | 2/1999 | El-Ghoroury et al. | |
| 5,870,588 A | 2/1999 | Rompaey et al. | |
| 5,898,595 A | 4/1999 | Bair et al. | |
| 5,907,494 A * | 5/1999 | Dangelo et al. | 703/1 |
| 5,912,678 A * | 6/1999 | Saxena et al. | 700/103 |
| 5,949,993 A | 9/1999 | Fritz | |
| 5,994,892 A | 11/1999 | Turino et al. | |
| 5,999,734 A | 12/1999 | Willis et al. | |
| 6,006,022 A | 12/1999 | Rhim et al. | |
| 6,026,219 A | 2/2000 | Miller et al. | |
| 6,035,123 A | 3/2000 | Razdan et al. | |
| 6,064,382 A * | 5/2000 | Diedrich et al. | 715/700 |
| 6,110,223 A | 8/2000 | Southgate et al. | |
| 6,122,634 A * | 9/2000 | Brodsky | 707/100 |
| 6,135,647 A * | 10/2000 | Balakrishnan et al. | 716/18 |
| 6,173,434 B1 | 1/2001 | Wirthlin et al. | |
| 6,182,206 B1 | 1/2001 | Baxter | |
| 6,195,593 B1 | 2/2001 | Nguyen | |
| 6,226,692 B1 | 5/2001 | Miloushev et al. | |
| 6,226,776 B1 | 5/2001 | Panchul et al. | |
| 6,260,182 B1 | 7/2001 | Mohan et al. | |
| 6,269,467 B1 | 7/2001 | Chang et al. | |
| 6,282,633 B1 | 8/2001 | Killian et al. | |
| 6,292,925 B1 * | 9/2001 | Dellinger et al. | 716/8 |
| 6,317,860 B1 | 11/2001 | Heile | |
| 6,321,369 B1 | 11/2001 | Heile et al. | |
| 6,324,678 B1 | 11/2001 | Dangelo et al. | |
| 6,360,350 B1 | 3/2002 | Gabele et al. | |
| 6,378,123 B1 | 4/2002 | Dupenloup | |
| 6,385,757 B1 | 5/2002 | Gupta et al. | |
| 6,408,428 B1 | 6/2002 | Schlansker et al. | |
| 6,421,808 B1 | 7/2002 | McGeer et al. | |
| 6,421,818 B1 | 7/2002 | Dupenloup et al. | |
| 6,425,116 B1 * | 7/2002 | Duboc et al. | 716/18 |
| 6,425,762 B1 | 7/2002 | Ernst | |
| 6,449,745 B1 * | 9/2002 | Kim et al. | 714/739 |
| 6,457,173 B1 | 9/2002 | Gupta et al. | |
| 6,477,683 B1 | 11/2002 | Killian et al. | |
| 6,477,697 B1 | 11/2002 | Killian et al. | |
| 6,536,033 B1 * | 3/2003 | Weerawarana et al. | 717/108 |
| 6,546,524 B1 | 4/2003 | Chankramath et al. | |
| 6,587,995 B1 * | 7/2003 | Duboc et al. | 716/4 |
| 6,631,508 B1 * | 10/2003 | Williams | 716/8 |
| 6,637,018 B1 | 10/2003 | Demler | |
| 6,701,515 B1 | 3/2004 | Wilson et al. | |
| 6,732,238 B1 | 5/2004 | Evans et al. | |
| 6,738,964 B1 * | 5/2004 | Zink et al. | 717/105 |
| 6,760,888 B2 | 7/2004 | Killian et al. | |
| 6,763,327 B1 | 7/2004 | Songer et al. | |
| 6,836,877 B1 * | 12/2004 | Dupenloup | 716/18 |
| 6,882,966 B2 * | 4/2005 | Ryu et al. | 703/14 |

FOREIGN PATENT DOCUMENTS

| | | |
|---|---|---|
| WO | WO 97 13209 A | 4/1997 |
| WO | WO 00/22553 | 4/2000 |

OTHER PUBLICATIONS

Design Automation for Embedded Systems, vol. 3, No. 1, Jan. 1988, (36 pages), article entitled "Retargetable Code Generation based on Structural Processor Descriptions", by Rainer Leupers and Peter Marwedel, University of Dortmund, Department of Computer Science.

Article entitled "Expression: An ADL for System Level Design Exploration" by Peter Grun, Ashok Halambi, Asheesh Khare, Vijay Ganesh, Nikil Dutt, and Alexandru Nicola, Department of Information and Computer Science, University of California, Irvine, CA, Technical Report #98-Sep. 29, 1998, (28 pages).

1996 IEEE Workshop on VLSI Signal Processing San Francisco, Oct. 1996, article entitled: "LISA—Machine Description Language and Generic Machine Model for HW/SW Co-Design" by Vojin Zivojnovic, Stefan Pees, and Heinrich Meyr, Integrated Systems for Signal Processing, Aachen University of Technology, Aachen, Germany (10 pages).

Article entitled: "ISOL: An Instruction Set Description Language for Retargetability" by George Hadjiyiannis, Silvina Hanono and Srinivas Devadas, copyright 1997, (4 pages).

Article entitled: "Generation of Software Tools from Processor Descriptions for Hardware/Software Codesign" by Mark R. Hartoog, James A. Rowson, Prakash D. Reddy, Soumya Desai, Douglas D. Dunlop, Edwin A. Harcourt, and Neeti Khullar, Alta Group of Cadence Design Systems, Inc., copyright 1997, (4 pages).

Article entitled: "DSP Processor/Compiler Co-Design A Quantitative Approach" by Vojin Zavojnovic, Stefan Pees, Christian Schlaeger, Markus Willems, Rainer Schoenen and Heinrich Meyr, Integrated Systems for Signal Processing, Aachen University of Technology, Germany, (no date), (pp. 761-765).

Article entitled "Compiled HW/SW Co-Simulation" by Vojin Zivojnovic and Heinrich Meyr, Integrated Systems for Signal Processing, Aachen University of Technology, Germany, copyright 1996, (6 pages).

Elms, A., "Tuning a Customisable RISC Core for DSP," Electronic Product Design, Sep. 1997, vol. 18, No. 9, pp. 19-20, 22, XP000909039.

Berekovic, Mladen, et al., A Core Generator for Fully Synthesizable and Highly Parameterizable RISC-Cores for System-On-Chip Designs, 1998 IEEE Workshop on Signal Processing Systems, pp. 561-568, XP-002137267.

"Custom-Fit Processors: Letting Applications Define Architectures" by Josh Fisher, Paolo Faraboschi, and Giuseppe Desoli, 1996 IEEE.

MDR—Microprocessor Report Article entitled "Tensilica Patents Raise Eyebrows" by Tom R. Halfhill dated Dec. 9, 2002.

Hartoog et al, "Generation of Software Tools from Processor Descriptions for Hardware/Software Codesign," ACM, Jun. 1997, pp. 303-306.

Freericks "The nML Machine Description Formalism" (Bericht 1991/15 pp. 3-41).

Fauth et al. "Describing Instruction Set Processors Using nML" (Proc. Euro. Design & Test Conf., Paris, Mar. 1995, IEEE 1995, 5 pp.).

Clucas, R.; "Designing with a customisable microprocessor core," Electronic Eng'g, vol. 71, No. 865, Feb. 1, 1999, p. 35.

Hogl, H., et al., "Enable + +: A General-Purpose L2 Trigger Processor," Nuclear Science Symp. & Medical Imaging Conf., vol. 2, Oct. 21-28, 1995, pp. 667-671.

Wollan, V., "A Design Methodology Achieving Fast Development Cycles for Complex VLSI Architectures," Proc. on the European Conf. on Design Automation, Feb. 22-Mar. 25, 1993, pp. 532-535.

Tensilica, Inc; Xtensa Instruction Set Architecture (ISA) Reference Manual Revision 1.0. (First 25 pages), 1998-1999.

Tensilica, Inc. Instruction Extension Language (TIE) Reference Manual Revision 1.3, 1998-1999.

Compton et al., "Configurable Computing: A Survey of Systems and Software," Technical Report, Northwestern University, Dept. of ECE, 1999.

Hauck et al., "The Chimaera Reconfigurable Functional Unit." Proceedings of the IEEE Symposium on Field-Programmable Custom Computing Machines, 1997.

Razdan et al., "A High-Performance Microarchitecture with Hardware-Programmable Function Units," Proceedings of MICRO-27, Nov. 1997.

Wang et al., "Hardware/Software Instruction Set Configurability for System-on-Chip Processors," Proceedings of Design Automation Conference, 2001.

Yang, Jin-Hyuk, et al., "MetaCore: A Configurable & Instruction-Level Extensible DSP Core," Proceedings of the ASP-DAC '98 Asian and South Pacific Design Automation Conference 1998, pp. 325-326, XP-002137268.

Campbell et al., "A Tutorial For Make", Proceedings of the 1985 ACM Annual Conference on the Range of Computing; mid-80's perspective, 1985, Denver, Colorado, United States, pp. 374-380 ISBN 0-89791-170-9.

"HDL Chip Design" by Douglas J. Smith, Ninth printing Jul. 2001, minor updates. First Printing Jun. 1996. Doone Publications. ISBN 09-9651934-3-8. pp. 1-25.

Rainer Leupers and Peter Marwedel, Retargetable Code Generation based on Structural Processor Descriptions, Design Automation for Embedded Systems, vol. 3, No. 1, Jan. 1998, p. 1-36.

George Hadjiyiannis, Silvina Hanono, and Scrinivas Devadas, ISDL: An Instruction Set Description Language for Retargetability, 4 pages. 1997.

* cited by examiner

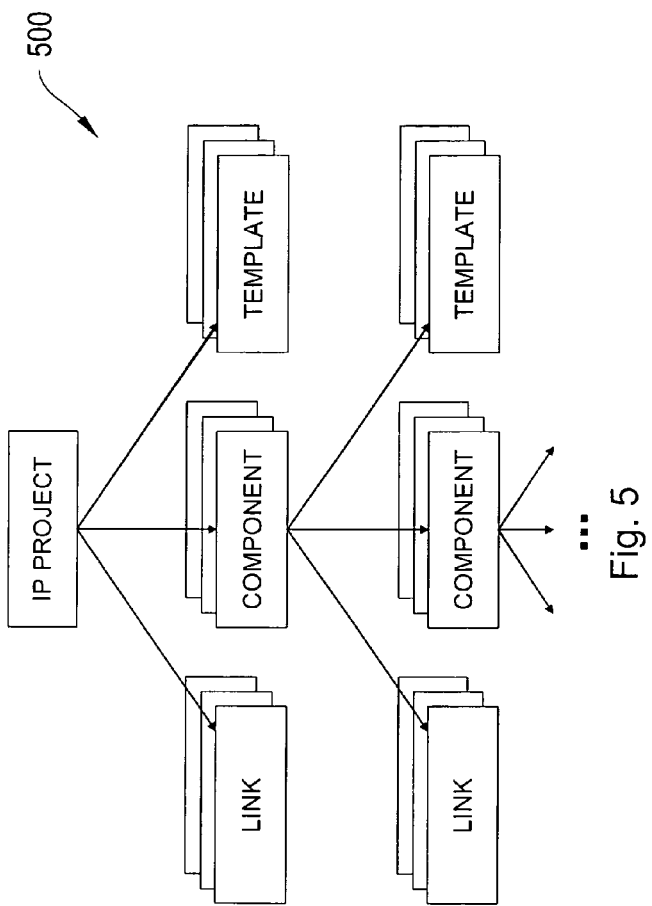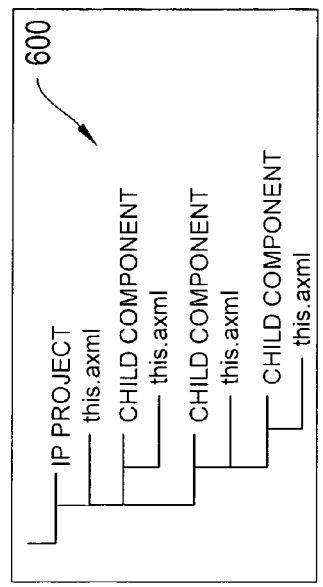
Fig. 5
Fig. 6

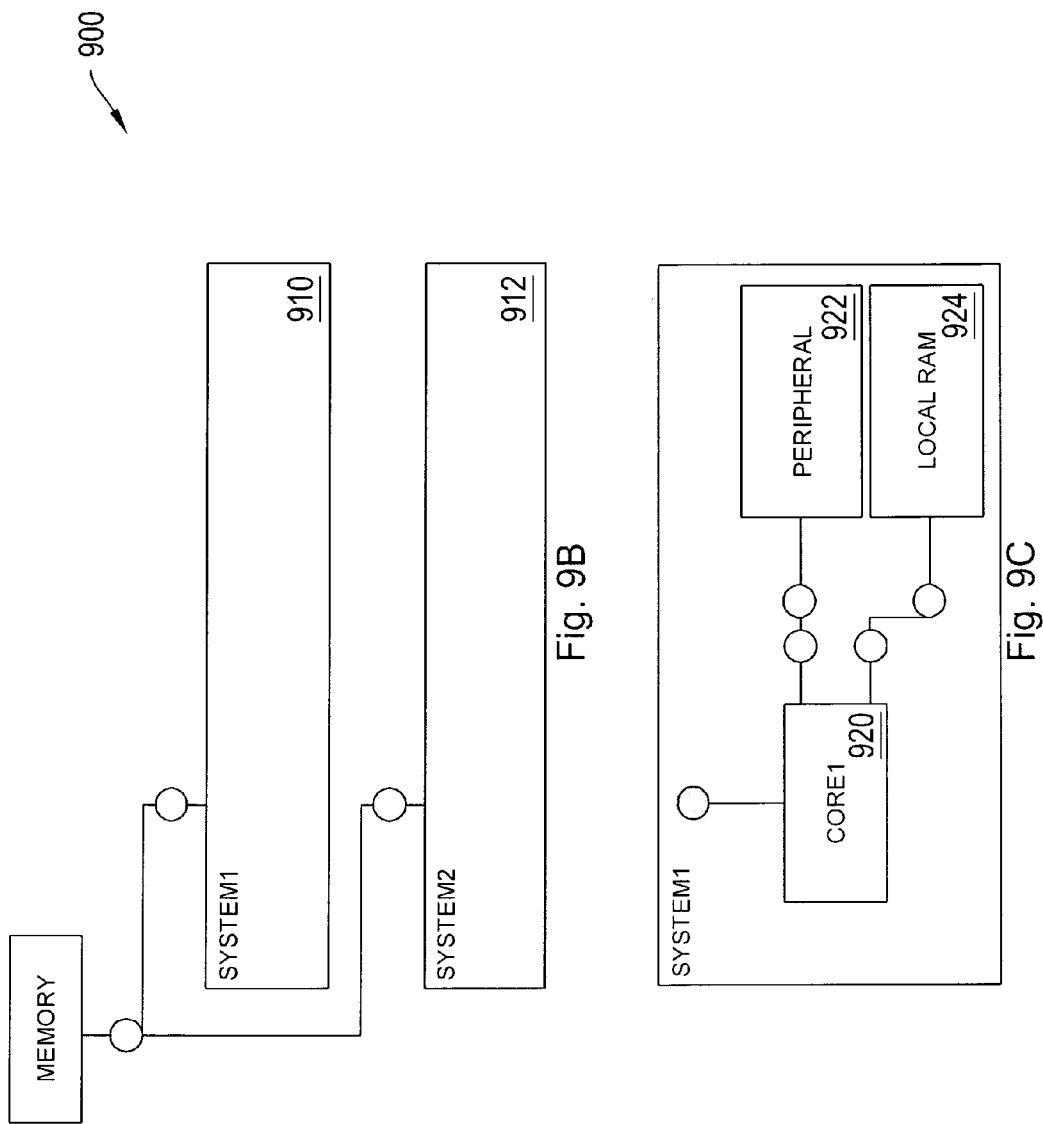

APPARATUS AND METHOD FOR MANAGING INTEGRATED CIRCUIT DESIGNS

PRIORITY AND RELATED APPLICATIONS

The present application claims priority to U.S. Provisional Patent Application Ser. No. 60/375,997, entitled "Apparatus and Method for Managing Integrated Circuit Designs" filed Apr. 25, 2002, which is incorporated herein by reference in its entirety (including all appendices thereto). The present application is related to U.S. patent application Ser. No. 09/418,663 filed Oct. 14, 1999, entitled "Method And Apparatus For Managing The Configuration And Functionality Of A Semiconductor Design," now issued as U.S. Pat. No. 6,862,563, which claims priority to U.S. Provisional Patent Application Serial No. 60/104,27 1 filed Oct. 14, 1998, of the same title, also incorporated herein by reference in their entireties.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. Field of the Invention

The invention relates generally to the field of integrated circuit design, and computer automated design for integrated circuits. More specifically, the invention provides a method for managing the configuration, design parameters, and functionality of a design for a system, and an integrated circuit design in which custom instructions or other design elements may be controlled by the designer.

2. Description of Related Technology

Several types of computer aided design (CAD) tools are available to design and fabricate integrated circuits (IC). Such computer-aided or automated IC design tools can include modules or programs addressing both the synthesis and optimization processes. Synthesis is generally defined as an automatic method of converting a higher level of abstraction to a lower level of abstraction, and can include any desired combination of synthesis techniques which occur at various levels of abstraction. So-called "behavioral synthesis" is a design tool wherein the behavior (e.g. inputs, outputs, and functionality) of a desired IC are entered into a computer program to design a device that exhibits the desired behavior. Such tools permit IC designers to produce increasingly complex and capable devices, sometimes having logic gate counts in the tens of millions, with few or no errors and in a much shorter time period than would be otherwise possible with manual design techniques such as hand layouts.

Examples of synthesis processes which involve different levels of abstraction include architectural level synthesis and logic level synthesis, both of which may be incorporated into the IC design process.

Architectural level synthesis is primarily concerned with the macroscopic structure of the circuit; it utilizes functional blocks (including information relating to their interconnections and internal functionality). Architectural level synthesis includes register transfer level (RTL) synthesis, which can have multi-bit components such as registers and operators.

Logic level synthesis, on the other hand, is concerned with gate level design. Logic level synthesis determines a microscopic structure of a circuit and transforms a logic model into an interconnection of instances of library cells. The result of the logic level synthesis is a netlist of logic devices and their interconnections. Logic-level synthesizers (so-called synthesis "engines") are available from several commercial vendors.

The synthesis process generally begins with the designer compiling a set of IC specifications based on the desired functionality of the target device. These specifications are then encoded in a hardware description language (HDL) such as VHDL® (VHSIC hardware description language) available from IEEE of New York, N.Y., or Verilog® available from Cadence Design Systems, Inc. of Santa Clara, Calif. The specifications define an IC in terms of the desired inputs and outputs, as well as desired functionality such as available memory or clock speed. From the HDL, the designer then generates a "netlist" including a list of gates and their interconnections, which is descriptive of the circuitry of the desired IC. Ultimately, the design is compiled and masks fabricated for producing the physical IC. FIG. 1 illustrates a typical prior art synthesis-based IC design and fabrication approach. See also, e.g., U.S. Pat. No. 6,324,678 to Dangelo, et al. issued Nov. 27, 2001 and entitled "Method and system for creating and validating low level description of electronic design", which discloses a methodology for generating structural descriptions of complex digital devices from high-level descriptions and specifications. The methodology uses a systematic technique to map and enforce consistency of the semantics imbedded in the intent of the original, high-level descriptions. The design activity is essentially a series of transformations operating upon various levels of design representations. At each level, the intended meaning (semantics) and formal software manipulations are captured to derive a more detailed level describing hardware meeting the design goals. Important features of the methodology are: capturing the users concepts, intent, specification, descriptions, constraints and trade-offs; architectural partitioning; what-if analysis at a high level; sizing estimation; timing estimation; architectural trade-off; conceptual design with implementation estimation; and timing closure.

Unfortunately, while well suited for simpler devices and single components, the aforementioned prior art approaches to automated IC design suffer several limitations, especially when applied to the design of more complex ICs such as CPU-based processors. These problems stem largely from the requirement that the instruction set be fixed prior to, and not modifiable during, the design and synthesis processes, thereby reducing the flexibility and capability afforded the designer both during and after the design process. These problems are highlighted by the practice of supplying pre-defined CPU designs to users desiring to integrate a processor into their systems Integrated Circuit design. Specifically, by not being able to consider certain instructions, functions, or components in the design during synthesis, the designer is required to attempt to "backfit" these elements to the design, which often times creates compatibility issues or other problems. This disability also effectively precludes optimization of the design for certain parameters (such as die size or clock speed) since the resulting design necessarily has a higher gate count, and does not have the benefit of customized instructions specific to the desired architecture and functionality. Furthermore, such prior art systems are incapable of automatically assembling a HDL model of the complete processor and simulating its operation, an approach which can greatly increase the efficiency and effectiveness of the design process.

Various approaches to addressing the aforementioned lack of user configurability and/or extensibility have been developed. Most notably, the "ARChitect" user-configurable design environment developed and sold by the Assignee hereof was the first truly user-configurable interactive processor design environment. The ARChitect configuration tool has a point-and-click user interface that facilitates customizing a basecase processor configuration. By stepping through screens and selecting options from menus, developers add new instructions, configure the instruction/data caches, choose DSP extensions, add scratchpad memory, configure interrupts, integrate peripherals, and customize many other features of the base processor architecture. The ARChitect tool can display a block diagram and programmer's model of the custom design, and it informs developers about the number of gates required. The ARChitect tool automatically generates the RTL files, synthesis scripts, and HTML-formatted documentation for the custom design. The ARChitect is also compatible with other development tools including for example (i) the MetaWare High C/C++™ Tool Suite, which provides the High C/C++ compiler, linker, assembler, profiler, and SeeCode™ task-aware debugger, plus an instruction-set simulator for the ARC processor; (ii) the ARC Signal Visualization Tool (SVT) which displays graphical views of data generated by signal-processing algorithms, and which can significantly accelerate the development and testing of DSP software on ARC processors configured with DSP extensions; and (iii) the CASSEIA (Cycle-Accurate Signal Simulator with Extensible Instruction Architecture) development and verification tool.

Yet another approach to processor design is disclosed in U.S. Pat. No. 6,477,683 to Killian, et al. issued Nov. 5, 2002 and entitled "Automated processor generation system for designing a configurable processor and method for the same", which describes an automated processor design tool. The tool includes a description of customized processor instruction set extensions in a standardized language to develop a configurable definition of a target instruction set, a Hardware Description Language description of circuitry necessary to implement the instruction set, and development tools such as a compiler, assembler, debugger and simulator which can be used to develop applications for the processor and to verify it. Implementation of the processor circuitry can be optimized for various criteria such as area, power consumption, speed and the like. Once a processor configuration is developed, it can be tested and inputs to the system modified to iteratively optimize the processor implementation.

Similarly, U.S. Pat. No. 6,477,697 to Killian, et al. issued Nov. 5, 2002 and entitled "Adding Complex Instruction Extensions Defined In A Standardized Language To A Microprocessor Design To Produce A Configurable Definition Of A Target Instruction Set, And HDL Description Of Circuitry Necessary To Implement The Instruction Set, And Development And Verification Tools For The Instruction Set" also discloses an automated processor design tool. The standardized language disclosed in this patent is capable of handling instruction set extensions which modify processor state or use configurable processors.

The "description" language taught in the '683 patent (TIE or Tensilica Instruction Extension) language is complicated and is limited in the types of instructions which it can define. Specifically, TIE-defined instructions cannot access or modify any information stored in special registers, i.e., processor state, which significantly restricts the range of instructions obtainable and therefore limit the amount of performance improvement achievable.

A number of so-called "hardware/software co-design" approaches are taught in the prior art. For example, numerous distinct behavioral (e.g., instruction set) and structural descriptions of the processor have been proposed. See, e.g., "EXPRESSION: An ADL for System Level Design Exploration," Technical Report No. 98-29, dated September 1998, and "LISA—Machine Description Language and Generic Machine Model for HW/SW Co-Design," Zivojnovic, et al., October 1996. See also "ISDL: An Instruction Se Description Language for Retargetability", Hadjiyiannis, et al., DAC, 1997. The Cadence nML language is also of note; see "Hartoog, et al, "Generation of Software Tools From Processor Descriptions for Hardware/Software Codesign," ACM, June 1997, pp. 303-306.

A somewhat similar co-design approach is described in "Retargetable Code Generation based on Structural Processor Descriptions", Leupers, et al., Design Automation for Embedded Systems, vol. 3, no. 1, January 1998, which describes the MIMOLA/TREEMOLA design language and tool suite. The MIMOLA approach is more akin to a hardware description language (such as for example VHDL) than the Expression, nML, LISA, or ISDL approaches, which are to a large extent geared toward cycle-accurate behavior (instruction) modeling and simulation.

U.S. Pat. No. 5,949,993 to Fritz issued Sep. 7, 1999 and entitled "Method for the generation of ISA simulators and assemblers from a machine description" discloses a method for generating software development tools to be used in hardware and software development. The invention is utilized by processing a hardware description and a syntax description of programmable electronics, such as a microprocessor, and generating a set of development tools useful to a hardware and/or software developer. Some of these tools include, for example, simulators, assemblers, decoders, disassemblers, behavior semantics, and attribute grammars. Fritz, however, does not teach explicit user-configurability from the standpoint of adding extensions and other features to the hardware description language representation of the design. Fritz in essence uses the hardware description model (e.g., VHDL model) as its input for the generation of software tools.

Despite their respective features, the foregoing solutions to user-customized processor design are not optimal. Specifically, significant complexity and/or "hand" customization are characteristic of many of these solutions, thereby detracting from their flexibility and adaptability to different design tasks and goals, especially where such design tasks are distributed across two or more entities or individuals.

The foregoing prior art solutions are also typically quite constrained in their operation; i.e., the design used as the basis is constrained at the outset, and the number of design variables kept to a minimum, such that the design generation process is manageable. This, however, restricts designers when they wish to explore design spaces which do not fit into the aforementioned "constrained" models.

Also, design tool configuration is largely fixed and not adaptable or extensible by the user for their specific tasks or projects.

Based on the foregoing, an improved method and associated apparatus is needed for managing the configuration, design parameters, and functionality of an integrated circuit design in which the configuration, to include the instruction set for processors and similar devices, can be interactively varied by the user. Specifically, such an improved method would permit the user to rapidly select desired design attributes (such as extension instructions, cache configuration, and the like) and generate designs based on these selections. These generated designs could then be evaluated interactively and modified as needed with a minimum of time and effort. Such improved design apparatus would also be highly flexible in its configuration, thereby allowing the user to "extend" the design environment as desired as well as the IC design itself, such as by adding plug-ins or additional tools to the environment which would facilitate additional functionalities. Such software environment would also make the design process more transparent (especially to less-than-skilled) designers, thereby increasing the prospective user base of the system. It would also be compatible with other environments, and therefore allow individual designers to share information across other environments, machines, and networks.

SUMMARY OF THE INVENTION

The present invention satisfies the aforementioned needs by providing an automated means of managing the configuration, design parameters, and functionality of an integrated circuit design, through the use of an interactive computer program.

In a first aspect of the invention, an improved method for managing the configuration, design parameters, and functionality of an integrated circuit design is disclosed. The method employs a substantially "iterative" design process as compared to the prior art, which allows the designer to integrate their extension component (such as an extension instruction or a peripheral component) into the software library. This means that by building the design description from the library, the added extension component is automatically integrated into the build.

In a second aspect of the invention, the aforementioned method is further embodied in a computer program which may be used in conjunction with a microcomputer or other similar device for designing and managing the configuration of integrated circuits. In one exemplary embodiment, this computer program comprises an object oriented environment with components which perform various sets or groups of related functions. In one variant, a combination of extensible markup language (XML), Java and Javascript are used to store both static and dynamic data.

In a second embodiment, an existing non-object oriented program is configured with an improved "toolset" module adapted for retrofitting to such non-object oriented applications.

In a third aspect of the invention, an apparatus for generating, simulating, and/or synthesizing an integrated circuit design using the aforementioned method is disclosed. In a first embodiment, a microcomputer having a microprocessor, display, and input device is used to run the previously referenced computer program, thereby allowing the designer to interact with the program during the design, simulation, and/or synthesis processes. The microcomputer further includes a storage device and network interface to allow for the storage, retrieval, and sharing of information between two or more microcomputers configured with the aforementioned computer program.

In a fourth aspect of the invention, a method for generating a hierarchy within an integrated circuit design having a plurality of components is disclosed. The method generally comprises providing at least some of the plurality of components with code, the components each having a first type of site; defining a second type of site on those of the plurality of components without the code; and joining at least some of the first and second sites, thereby generating a hierarchy.

In a fifth aspect of the invention, a method for generating an integrated circuit design build having a plurality of components is disclosed. The method generally comprises providing at least some of the plurality of components with code, the components each having a first type of site; defining a second type of site on those of the plurality of components without the code; joining at least some of the first and second sites, thereby generating a hierarchy; querying the top most component in the hierarchy for its code; reading the code from the top component; merging in code from at least one component linked to the top component; and repeating the acts of querying and merging throughout the hierarchy to produce the build.

In a sixth aspect of the invention, an integrated circuit design depicted in a hardware description language and synthesized using the aforementioned method of the invention is disclosed. In one exemplary embodiment, the integrated circuit comprises an extended RISC processor used in an embedded application.

In a seventh aspect of the invention, an integrated circuit fabricated using the aforementioned synthesized design is disclosed. In one exemplary embodiment, the integrated circuit comprises a pipelined reduced instruction set CPU (RISC) processor.

In an eighth aspect of the invention, the aforementioned program includes a complete Javascript debugger which allows the user to set breakpoints on their data, and step through various calculations or operations as they happen in an actual design project.

In a ninth aspect of the invention, an improved method of storing the component instances in permanent storage is provided. In one exemplary embodiment, the Operating System's (OS) file system is used to store the data in simple hierarchical data structure. Alternatively, a database manager such as dBase, Oracle, and similar database management systems may be employed to achieve that same function through the use of systems API functions to mimic the operating system behavior with respect to files. Using a standard file system means that the user has many existing tools with which to manage their project.

In a tenth aspect of the invention, an improved design library structure is provided that is easy to manage and free of nomenclature. This structure includes ensuring that components in the library are named uniquely so that different design entities do not create components with the same name is provided, as well as methods of integrating object (e.g., Java) classes into the library structure.

In an eleventh aspect of the invention, an improved method for specifying a default connection strategy on a site-by-site basis is provided. This is required since there are many different connection schemes that can be used with a given set of components, with no one scheme suitable for all components. The present invention enables the creator of the components to specify a connection scheme for each site (interface) on their component. The scheme is coded as either a piece of script (e.g., Javascript) or a (Java) class, the script/class being run to provide the system with information on how to connect the component.

In a twelfth aspect of the invention, an improved method for generating templates of projects or design blocks is disclosed The templates are stored in a library, and can be distributed in whole or part to other designers or the end-user of the design. Furthermore, the designer can use a single template instantiated many times to create a design with multiple instances of the same components or blocks. Changing the template simultaneously changes all of the instances of the component/block, thereby obviating component-by-component modification.

In a thirteenth aspect of the invention, an improved method of managing GUIs is disclosed. The present invention discloses using GUIs which are part of the component definition. To enable this functionality, portions of the GUI code are distributed with the component(s). In one exemplary embodiment, Java language is utilized to define cross-platform code including GUI objects. This code can be plugged into the GUI at runtime without having to recompile the code. GUI routines (e.g., "wizards") are distributed as object classes, so they can be dynamically included into the running application.

In a fourteenth aspect of the invention, improved techniques for managing the display of information relating to the varied design components are provided. In one embodiment, the components are categorized based one or more categorization criteria, and configured to contain this category information. The display/GUI functions can then identify components based on their category attributes, and display them as desired.

In a fifteenth aspect of the invention, an improved approach to managing component dependencies and constraints is disclosed. Data related to design dependencies/constraints is stored in the component definitions themselves. These dependencies are expressed as scripts (e.g., Javascript) or Java classes which allows them to be made as complex or as simple as desired.

Additionally, the present invention utilizes the encapsulation of information by using build information from each component to create a "build hierarchy". So-called "parent" and "child" sites are defined on the various components, thereby effectively specifying the build hierarchy when the components are joined by links.

In a sixteenth aspect of the invention. a user-extensible toolset which accommodates and facilitates user addition of "plug-ins" is disclosed. In one exemplary embodiment, Java class files are disposed in a predetermined directory of the storage device. The tools examine the classes in that directory using the Java reflection mechanism, thereby facilitating use of the plug-ins by the tools.

In a seventeenth aspect of the invention, an improved method of addressing data using a "dot" operator is disclosed. The script stored in the libraries of the system are provided with a method of retrieving information (including data from the component type or instance) using a "dot" operator. Paths within the system are split into subcomponents (the first of which indicates type or instance data), and each subsequent subcomponent is sequentially invoked to return one or more objects associated with that function.

In an eighteenth aspect of the invention, an improved computerized system adapted to generate a design of an integrated circuit is disclosed. In one exemplary embodiment, the design comprises a plurality of components represented by encapsulated objects, the objects each having at least one interface with another object, the at least one interface containing information relating to data transferred across that interface. For example, the plurality of components can comprise a processor core and an extension instruction, the information comprising HDL that must be added to HDL associated with the core for implementation of the extension. The information can comprise a script which is evaluated at runtime to retrieve the required data.

In a nineteenth aspect of the invention, an improved computerized system for generating designs of integrated circuits is disclosed. In one exemplary embodiment, at least one extensible GUI tree is provided, the extensible GUI tree permitting a user to specify the relationship between the tree and at least one plug-in module.

In a twentieth aspect of the invention, a improved design system is disclosed, wherein the system is adapted to automatically generate customized documentation associated with the specific configuration selected by said user.

In a twenty-first aspect of the invention, a computerized system for generating an integrated circuit design is disclosed, wherein a build sequencer adapted to permit a user to selectively utilize one or more of a plurality of substantially separate build sequences during generation of said design is provided.

In a twenty-second aspect of the invention, a computerized system for generating a design of an integrated circuit comprising at least one module adapted to generate a topological representation of the design based on information provided by each component within the design is disclosed.

BRIEF DESCRIPTION OF THE DRAWINGS

FIG. 5 is a graphical representation of the design hierarchy associated with the structures of FIG. 4.

FIG. 6 is a graphical representation of an exemplary project directory structure.

DETAILED DESCRIPTION

Figure 1:
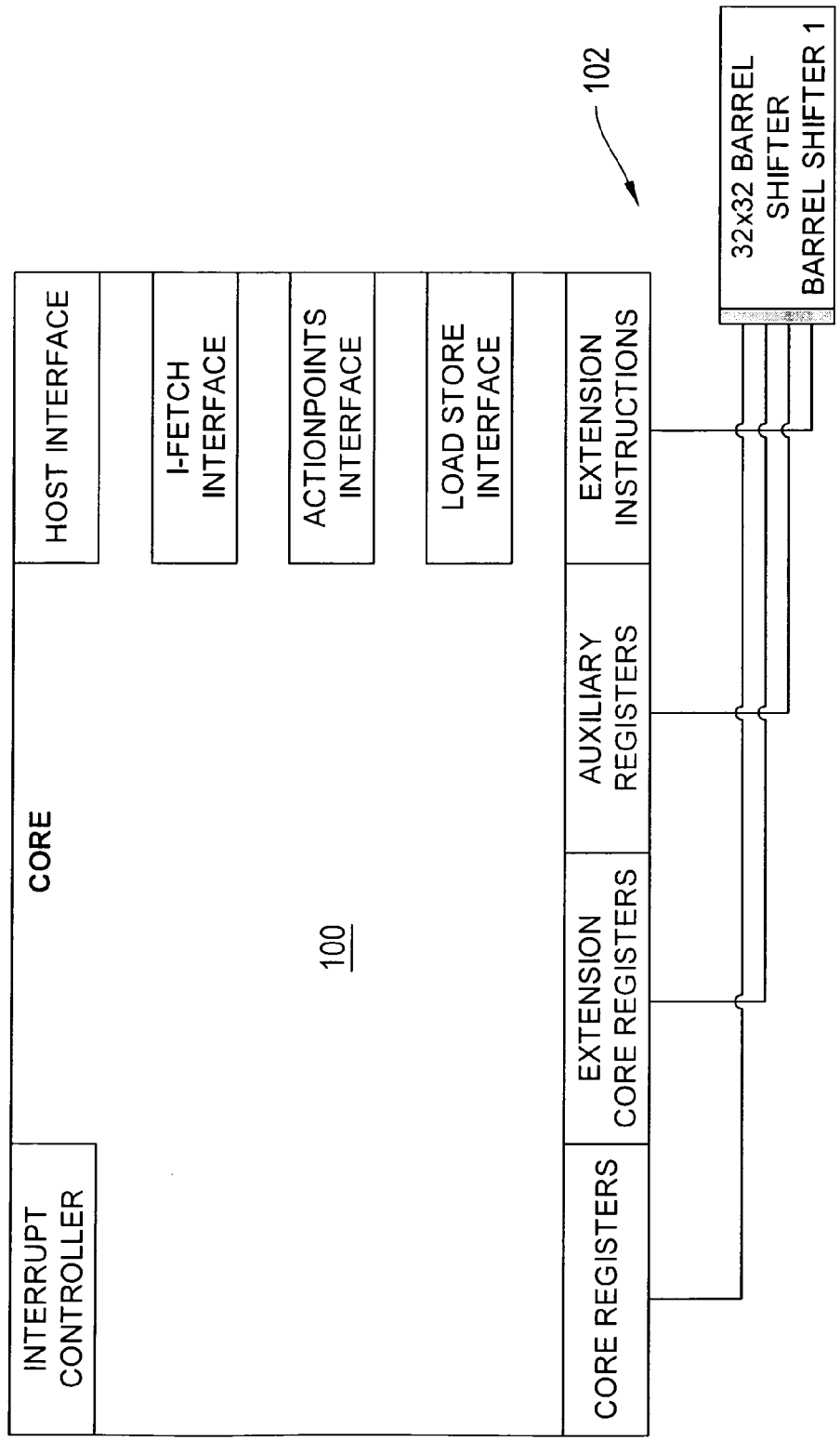
FIG. 1 is a block diagram of an exemplary processor core and associated components.

Reference is now made to the drawings wherein like numerals refer to like parts throughout.

As used herein, the terms "computer program," "routine," "subroutine," and "algorithm" are essentially synonymous, with "computer program" being used typically (but not exclusively) to describe collections or groups of the latter three elements. Such programs, routines/subroutines, and algorithms being rendered in any language including, for example, an object-oriented language. In general, however, all of the aforementioned terms as used herein are meant to encompass any series of logical steps performed in a sequence to accomplish a given purpose.

As used herein, the term "IP" refers generally to intellectual property which includes, without limitation, IC designs, methods, processes, schematics, code, hardware description language models, configurations ("builds"), scripts, logic level representations, and software objects and components (and their descriptions), which may be used or generated by an individual or system.

Any references to hardware description language (HDL) or VHSIC HDL (VHDL) contained herein are also meant to include other hardware description languages such as Verilog®, VHDL, Systems C, Java®, or any other programming language-based representation of the design. Furthermore, an exemplary Synopsys® synthesis engine such as the Design Compiler 2000.05 (DC00) may be used to synthesize the various embodiments set forth herein, or alternatively other synthesis engines such as Buildgates® available from, inter alia, Cadence Design Systems, Inc., may be used. IEEE std. 1076.3-1997, IEEE Standard VHDL Synthesis Packages, describes an industry-accepted language for specifying a Hardware Definition Language-based design and the synthesis capabilities that may be expected to be available to one of ordinary skill in the art.

As used herein, the term "processor" is meant to include any integrated circuit or other electronic device (or collection of devices) capable of performing an operation on at least one instruction word including, without limitation, reduced instruction set core (RISC) processors such as for example the ARCompact™ A5 and ARCtangent™ A4 user-configurable ISAs/cores manufactured by the Assignee hereof (each described in detail below), central processing units (CPUs), and digital signal processors (DSPs). The hardware of such devices may be integrated onto a single substrate (e.g., silicon "die"), or distributed among two or more substrates. Furthermore, various functional aspects of the processor may be implemented solely as software or firmware associated with the processor.

Additionally the term "stage" as used herein refers to various successive stages within a pipelined processor; i.e., stage 1 refers to the first pipeline stage, stage 2 to the second pipeline stage, and so forth. Such stages may comprise, for example, instruction fetch, decode, execution, and writeback stages.

ARCompact™ is an innovative instruction set architecture (ISA) that allows designers to mix 16 and 32-bit instructions on its 32-bit user-configurable processor. The key benefit of the ISA is the ability to cut memory requirements on a SoC (system-on-chip) by significant percentages, resulting in lower power consumption and lower cost devices in deeply embedded applications such as wireless communications and high volume consumer electronics products.

The main features of the ARCompact ISA include 32-bit instructions aimed at providing better code density, a set of 16-bit instructions for the most commonly used operations, and freeform mixing of 16- and 32-bit instructions without a mode switch—significant because it reduces the complexity of compiler usage compared to competing mode-switching architectures. The ARCompact instruction set expands the number of custom extension instructions that users can add to the base-case ARCtangent™ processor instruction set. The existing processor architecture already allows users to add as many as 69 new instructions to speed up critical routines and algorithms. With the ARCompact ISA, users can add as many as 256 new instructions. Users can also add new core registers, auxiliary registers, and condition codes. The ARCompact ISA thus maintains and expands the user-customizable and extensible features of ARC's extensible processor technology.

As 32-bit architectures become more widely used in deeply embedded systems, code density can have a direct impact on system cost. Typically, a very high percentage of the silicon area of a system-on-chip (SoC) is taken up by memory.

The ARCompact ISA delivers high density code helping to significantly reduce the memory required for the embedded application, a vital factor for high-volume consumer applications, such as flash memory cards. In addition, by fitting code into a smaller memory area, the processor potentially has to make fewer memory accesses. This can cut power consumption and extend battery life for portable devices such as MP3 players, digital cameras and wireless handsets. Additionally, the new, shorter instructions can improve system throughput by executing in a single clock cycle some operations previously requiring two or more instructions. This can boost application performance without having to run the processor at higher clock frequencies.

The support for freeform use of 16 and 32-bit instructions allows compilers and programmers to use the most suitable instructions for a given task, without any need for specific code partitioning or system mode management. Direct replacement of 32-bit instructions with new 16-bit instructions provides an immediate code density benefit, which can be realized at an individual instruction level throughout the application. As the compiler is not required to restructure the code, greater scope for optimizations is provided, over a larger range of instructions. Application debugging is more intuitive because the newly generated code follows the structure of the original source code.

The ARCompact ISA is described in greater detail in co-pending U.S. provisional patent application Serial No. 60/353,377 entitled "CONFIGURABLE DATA PROCESSOR WITH MULTI-LENGTH INSTRUCTION SET ARCHITECTURE" filed Jan. 31, 2002, assigned to the Assignee hereof, and incorporated by reference herein in its entirety.

The ARCtangent™ processor is a user-customizable 32-bit RISC core for ASIC, system-on-chip (SoC), and FPGA integration. It is synthesizable, configurable, and extendable, thus allowing developers to modify and extend the architecture to better suit specific applications. The ARCtangent microprocessor comprises a 32-bit RISC architecture with a four-stage execution pipeline. The instruction set, register file, condition codes, caches, buses, and other architectural features are user-configurable and extendable. It has a 32×32-bit core register file, which can be doubled if required by the application. Additionally, it is possible to use large number of auxiliary registers (up to 2E32). The functional elements of the core of this processor include the arithmetic logic unit (ALU), register file (e.g., 32×32), program counter (PC), instruction fetch (i-fetch) interface logic, as well as various stage latches. FIG. 1 is a block diagram illustrating a typical ARCtangent processor core 100 and associated extension instruction 102.

Overview

As discussed in greater detail below, the present invention takes in one embodiment the form of a computer program particularly adapted for designing, configuring, and evaluating integrated circuits. This computer program provides for a great degree of user customization to achieve the desired result; i.e., the efficient and rapid design of ICs having particular attributes and functionality. Specifically, in the case of pipelined processor cores, this user customization allows the designer to readily add extensions (e.g., instructions) adapted for performing specific operations such as Viterbi decode, FFT, etc. to the core. These instructions and other elements (such as special-purpose registers, new condition code choices, local scratchpad RAM, a library of multimedia extensions for 3D or DSP applications, etc.) may be arbitrarily added to the existing instruction set by the designer as well during the design process. Unlike adding an external ASIC or other component post-synthesis to the subject systems or integrated circuit design, these instructions become included within the processor instruction and register set so as to eliminate integration problems, and allow maximal optimization based on one or more selected attributes. This method further affords the designer the ability to generate an HDL model of the entire IC, thereby greatly enhancing the efficiency of the design process. This ability is especially useful for complex processor designs, although it may readily be applied to other types of components.

Existing solutions to providing such user-configurable designs include the exemplary generalized method of co-owned U.S. patent application Ser. No. 09/418,663 entitled "Method And Apparatus For Managing The Configuration And Functionality Of A Semiconductor Design", now issued as U.S. Pat. No. 6,862,563, filed Oct. 14, 1999, which is incorporated herein by reference in its entirety, as embodied in the "ARChitect" design software previously described herein. The present invention provides significant improvements over such prior approaches through, inter alia, the adoption of object-oriented programming and scripting and a variety of features relating thereto. Specifically, the present invention addresses several needs left unanswered by prior solutions, including (i) the easy and efficient addition of a large number of extensions to a design; (ii) enabling data-driven tools by providing storage for the data that drives them; (iii) providing a single repository for each processor or IC design for all tools to share; and (iv) defining a format for information exchange. These attributes and others, as well as exemplary embodiments of the invention, are now described in detail.

(i) Enabling Data-Driven Tools

Each time a designer adds an extension to the processor core, a great deal of time is spent integrating that extension into the existing toolset. Specifically, the EDA tool must be updated, the graphical user interface (GUI) must be changed, etc. While practical for configurations specific to a processor design or a small number of extensions, this approach soon becomes unworkable for larger numbers (i.e., hundreds, or even tens of new extensions) typical of systems on a chip design. Therefore, to speed up development of extensions and the integration of peripherals, the present invention advantageously converts existing tools to make use of a more "data-driven" model. The data to drive the new tools must be stored somewhere ideally both centralized and accessible in a number of different respects; accordingly, a "configuration database" is used in one exemplary embodiment.

The Assignee hereof has also recognized the utility of implementing "plug-ins" to the existing IP Library (containing processor and peripherals), the central concept being that IP vendors can author their own extension components which they can then integrate into the IP Library using the present invention. The IP vendors extension component can then be distributed independently, and included in the hardware and software build process to create a fully integrated design implementation. This is only possible with existing technology (such as the ARChitect software manufactured by the Assignee hereof and previously referenced herein), with significant work required to extend the functionality of the technology (i.e. ARChitect). One goal of the present invention, therefore, is to make the aforementioned distribution/integration process as seamless as possible. The configuration database of the present invention enables this by providing the interface to the core and tools.

(ii) Single Design Repository

Another primary feature of the present invention is the use of a single centralized or distributed repository for each processor core or IC design for all tools to share. For example, in one exemplary embodiment described in greater detail below, the user selects the core settings from within a program tool, with the same settings being used by the other software tools (e.g., SeeCode debugger, profiler, etc.). The present invention therefore allows the software tool set to work together as a cohesive unit, by providing a common data store for each configuration. Some existing solutions incorporate the concept of templates, which store the control settings, but this information is not used by the other tools.

This approach is also advantageously applied to designs having a single extended core, multiple cores with homogeneous extension instruction/feature sets, or multiple cores with heterogeneous extension instruction/feature sets.

(iii) Definition of a Format for Information Exchange

The adoption of a standardized information exchange such as that provided by the present invention is beneficial in a number of areas, including:

a) Design organization efficiency—Under the prior art, each component or extension of a processor/IC is built co-operatively by a number of different design teams. The output from these teams is then integrated to create the product. A database such as that provided herein provides a single logical store for all information relating to the component, with each team working on their own component/extension(s), such logical store may consist of for example a single file, multiple files on a single storage medium, a local database or a distributed database. This results in greater organizational efficiency, since, less programmatic integration is needed.

b) Design organization/customer integration—The aforementioned database which is used within the design organization to develop the component or extension(s) can be used to form the basis of the product sent to customers, thereby facilitating more efficient interaction between these two entities, and less "translation". Furthermore, the use of a standardized exchange format facilitates other third-party designers in generating new custom extensions useful with the core/IC for the customer and/or the primary design organization.

Specific Design Attributes

The foregoing features and functionality are implemented in the present invention through the following particular design attributes. Specific exemplary implementations (Java-based) of these attributes are contained in Appendix II to the above-referenced provisional patent application to which the present application claim priority and which is incorporated herein by reference, although it will be recognized that other coding and languages may be substituted based on the particular needs of the developer.

1) Configurable IP encapsulation using XML, Javascript™ and Java™—In one exemplary embodiment, the invention uses a combination of extensible markup language (XML), Java and Javascript to store both static and dynamic data. It is particularly advantageous to use platform-independent or agnostic formats for the data so that the data and associated IP works on all platforms and operating systems. One exemplary variant stores the data as files for sake of simplicity; however, as described in greater detail below, a relational database or object database may be implemented if desired. Using XML as the primary storage format means that the data is stored in human-readable text files. This provides a simple way of viewing the data stored (code "transparency"), as well as integration with existing development tools such as source code control systems. Non proprietary encryption schemes have also been utilized that allow the XML and IP to be fully encrypted prior to distribution, the decryption is then controlled at the users site.

The integration of Java into the data enables a close coupling between the data and the tools that manipulate the data. For example, the data is loaded from disk or other storage location into Java objects automatically, so the code that reads and writes the information does not have to perform any conversion.

The integrated Javascript also provides extensive scripting support. By embedding strings in the XML, Javascript statements and expressions can be inserted into the data. The Javascript interpreter used also allows the script to use Java objects, so this embodiment of the invention has complete interoperability between the XML, Java and Javascript.

2) Integrated debugger in IP authoring tools—The present invention includes the ability to describe dynamic data within the IP. For example, the gate count of the aforementioned ARCtangent core is not static. Changing the bus width, adding extensions, etc. will change the gate count. Therefore, the information on the gate count must be a dynamic representation (e.g., a piece of Javascript) rather than a static number. This representation performs various mathematical calculations based on the various design options the user has chosen, and any extensions they have added to the core, and returns a numerical value. In order to include these calculations into the IP, means for running them within a debug environment (including stepping through the calculation, viewing variable values, etc.) is required. Hence, the present invention optionally contains a complete Javascript debugger which allows the user to set breakpoints on their data, and step through various calculations as they happen in an actual (i.e., non-simulated) IP project.

3) Integrated IP authoring and configuration—The present invention employs a substantially "iterative" design process as compared to the prior art. Under these prior art approaches, the designer would typically build the core with the extensions required, and then modify the HDL and other components to accommodate the added instruction. If, for some reason, the designer then wished to change the processor core design, they would be required to generate the HDL again, and add the instruction HDL code (whether by hand or otherwise) again as well.

In contrast, the iterative approach of the present invention allows the designer to integrate their extension component (e.g., instruction) into the software library. This means that by building the HDL (e.g., VHDL) in the library, the added instruction is automatically integrated into the build. The methodology is therefore shifted from effectively hand-crafting VHDL to accommodate instructions to integrating it into the software library.

To facilitate this shift in methodology, the software must place a greater emphasis on the integration of IP into the Library. This is referred to in the present context as 'IP authoring'. To enable this process to work efficiently, integrated authoring and use is needed. In other words, the authoring functionality must coincide with the existing functionality of using the IP. The aforementioned (Javascript) debugger built into the software permits the user to see their script running as it is used. For example, replacement variables in VHDL are expanded as the VHDL is built; the user can now place a breakpoint on their variable script, and see it being executed as the VHDL is built.

4) Separation of IP definitions and instances into libraries and projects.—As part of the object-oriented approach to IP delivery, one or more repositories are needed to store the IP component definitions, and instances. The present invention employs the concepts of encapsulation, data hiding, and to a lesser extent polymorphism to achieve this objective.

5) IP Project file structure—The present invention employs a method of storing the components instances in permanent storage that it is easy to manage. This constitutes a so-called 'IP Project'. The Operating System's (OS) file system is used to store the data in simple hierarchical data structure. Alternatively, a database manager such as dBase, Oracle, and similar database management systems may be employed to achieve that same function through the use of systems API (application programming interface) functions to mimic the operating system behavior with respect to files. Such APIs are very well known to one skilled in the art of operating systems and are not further described herein. In one exemplary embodiment, a simple tree structure based on the file system's directory structure is employed. Each component instance in the project has its own directory on the storage device (e.g., hard drive) which can in turn contain other components. In addition, each component has a '_data_' directory for storing any data associated with that component (e.g. options). A '_library_' directory, which is a library owned by the component, is also optionally provided, as described in greater detail below.

Using a standard file system means that the user has many existing tools with which to manage their project. For example, they can share projects using existing file servers, source code control systems etc. They can also manage their projects using file managers/file compression programs, etc. Furthermore, existing tools that relate to or utilize IP do not have to be modified to store the data in a database or proprietary data store. For example, C/C++ code which is part of an exemplary component is stored in a specific directory, and then the existing compiler can use it without modification.

6) IP Library structure—The present invention also advantageously provides a library structure that is easy to manage and free of nomenclature. Specifically, a method of ensuring that components in the library are named uniquely (so that different design entities do not create components with the same name) is provided, as well as methods of integrating (Java) classes into the library structure. The basic library storage is simply the OS's file system. However, in the exemplary embodiment, the way in which directories are laid out is analogous to the Java package structure.

Using the file system for storage makes the library easy to manage. Existing tools can be used to view, manage, and modify the library. By basing the library format on the Java package convention, Java classes can be included as part of components in the library, and that component names are unique. This also allows for a tight integration with the Java package structure. The library can be added to the class path of the Java application, and the classes stored in the library can be accessed as normal.

In an exemplary directory structure, the lowest level directories represent component types and link types. These comprise directories too, and accordingly contain other files and directories.

7) Defining IP relationships using sites, links and variables—The present invention provides the ability to define various different IP components, and how they relate to each other. The system tools are informed as to how the IP components can be connected together, and what sort of information defines those relationships. Prior art techniques, on the other hand, typically hard code this information into each application that uses the IP.

By specifying exactly what types of relationships the different IP components have, and the information that is passed as part of those relationships, connection of the components in a correct topology is ensured. In addition, the designer can also verify that all information that is required to integrate a component into the tools is present.

8) Component link patterns—When components are added to a design, there are many potential ways in which they can be connected. The present invention provides a technique for specifying a default connection strategy on a site-by-site basis. This is required since there are many different connection schemes that can be used with a given set of components, with no one scheme suitable for all components. The present invention enables the creator of the components to specify a connection scheme for each site (interface) on their component. The scheme is coded as either a piece of script (e.g., Javascript) or a (Java) class, the script/class being run to provide the system with information on how to connect the component. This approach incorporates the aforementioned encapsulation concept; the tool does not know how to connect a given component, but rather the component itself has that information encapsulated within itself.

9) Projects stored in libraries as templates—Designers often do not want to create a project from scratch, but instead require a preconfigured IP project which they can then modify to generate their final design. They may also want pre-configured 'blocks' of design which can be incorporated into an existing project. The present invention provides the ability to generate templates of projects or design blocks, thereby satisfying this need. The templates are stored in a library, and can be distributed in whole or part to other designers or the end-user of the design. Furthermore, the designer can use a single template instantiated many times to create a design with multiple instances of the same components or blocks. Changing the template simultaneously changes all of the instances of the component/block, thereby obviating component-by-component modification.

10) Build tool definitions stored in libraries—The methodology of setting up the build process for a given project is in many respects as unique as the resulting HDL itself. In one embodiment, the build process is effectively a series of steps which the user can modify/add/remove. Prior art techniques use, for example Unix "makefiles" to specify the build process. The present invention, however, stores one or more build "processes" in the libraries and project. For example, the build processes 'VHDL builder', 'Hierarchy Builder', and Tests Builder' may all be stored in the library, and can be added to a design to specify how it is built. Sub-processes such as 'Generate Hierarchy', 'Async to Sync', 'Generate Rams' are also provided, thereby allowing the designer to generate a custom build process from these sub-components, in much the same fashion that individual design components are used to build a design. The build processes may advantageously create IP with uniquely instantiated variable names to permit multiple copies of the IP block to be used per design. This advantage is particularly useful for creating multi-processor systems-on-chip designs.

11) Extensible/Dynamic GUIs—New components often require changes to the graphical user interface (GUI) so that there are new panels, menus and dialogs for the new component. In many prior art design approaches, the GUI is changed by hand each time a new component is added to the system. The present invention addresses this problem by providing GUIs which are part of the component definition. To enable this functionality, portions of the GUI code are distributed with the component(s). In one exemplary embodiment, Java language is utilized to define cross-platform code including GUI objects. This code can be plugged into the GUI at runtime without having to recompile the code. GUI routines (e.g., "wizards") are distributed as Java classes, so they can be dynamically included into the running application. This means that the developer of a component can also create the GUI components which are required to use it, and then distribute those within the component.

The GUI(s) of the present invention are also generated automatically at runtime from the information stored in the library. For example, the options that a component has are stored in the component definition, which the relevant tool analyzes, and from which it creates a suitable GUI at runtime.

12) Automatic update of IP data—The present invention is optionally configured to gather updates to components or other relevant data automatically via a network interface (e.g., the Internet, internets, intranet, LAN, WAN, etc.) as supplied by an "IP update" server or other entity, and inform the user of new data, updates, etc. located or downloaded. In this fashion, outdated information present on the user's local system is automatically replaced during use of the software, thereby providing a running update functionality. Such updates provide an improved mechanism for user support wherein required IP updates may be automatically included in the "build" to guarantee that erroneous behaviors associated with outdated copies of the IP are eliminated.

13) IP type categorization for display—The library of the present invention can contain many different IP components, including hardware, software, tests, etc. Accordingly, the present invention provides the ability for the user to manage the display of information relating to these varied components. Specifically, the components are categorized based one or more categorization criteria, and configured to contain this category information. The display/GUI functions can then identify components based on their category attributes, and display them as desired.

14) Human readable links—Under the prior art, the description of an IP project using links, sites and components is not always readily understood, even by the skilled designer. This is particularly true if the designer is not well versed in the minutia of the IP design. The present invention addresses this issue by generating descriptive link elements which describe the project. In one embodiment, this description is in a plain language (e.g., English) so that the user can rapidly identify the relationships between components. This makes the design tool as a whole more intuitive and accessible by a broader class of potential users.

15) Components contain their dependencies—Each component in a design has a large number of dependencies and constraints which change based on its context. For example, an instruction cache cannot have a memory bus width which is bigger than that of the core it is used in. The tools need to be aware of these dependencies and constraints in such a way that they are not hard-coded into tools. Accordingly, the present invention stores the data for these dependencies/constraints in the component definitions themselves. These dependencies are expressed as scripts (e.g., Javascript) or java classes which allows them to be made as complex or as simple as desired.

16) Build information for each component stored in component definition—Prior art solutions typically utilize "hard coded" information about how to build a given device and any associated extensions. On the contrary, the present invention utilizes the encapsulation of information by using build information from each component to create a "build hierarchy". So-called "parent" and "child" sites are defined on the various components, thereby effectively specifying the build hierarchy when the components are joined by links.

17) Tool extensibility using plug-ins—The present invention further provides for a user-extensible toolset which accommodates and facilitates user addition of "plug-ins". In one exemplary embodiment, Java class files are disposed in a predetermined directory of the storage device. The tools examine the classes in that directory using the Java reflection mechanism, thereby facilitating use of the plug-ins by the tools.

18) Addressing data using the "dot" operator—The script stored in the libraries of the system are provided with a method of retrieving information (including data from the component type or instance) using a "dot" operator. Paths within the system are split into subcomponents (the first of which indicates type or instance data), and each subsequent subcomponent is sequentially invoked to return one or more objects associated with that function.

19) Variables across links—The links define the relationships between the components. The definition of the relationships often include data that must be transferred across the links. For example, extension instructions must tell the core what VHDL it adds to the core VHDL. The present invention is configured such that each site in a given component contains information on the data that is transferred across that site. This information is in the form of 'variables'. In one embodiment, each variable is a piece of Javascript which is evaluated at runtime to retrieve the data.

20) Extensible GUI trees using plug-ins—Much of the GUI of the present invention is based on the conventional tree user interface component. However, since the tools are configured to allow 3rd party developers to add their own types of data into the library, this data must be shown on the trees in a useful way. Ideally, the designer of the data should be able to specify how their data is shown in a tree. Accordingly, the present invention allows tools to obtain information or instructions which tell the tool how to add data to the tree.

Exemplary Embodiment of Software

An exemplary version of the software embodying the methods and architecture of the present invention is now described. It will be appreciated that while the following discussion is cast primarily in terms of design software used with the ARCompact ISA and ARCtangent processor previously described herein, the present invention may be equally applied to other types of processors and ICs (including ASICs, FPGAs, DSPs, CISC processors, microprocessors), and ISAs as referenced above.

Additionally, while the following description is presented in terms of a Java-based environment running on a microcomputer or other similar processing device, it can be appreciated that other software and hardware environments (including minicomputers, workstations, networked computers, "supercomputers", and mainframes) may be used to practice the methods. Additionally, one or more portions of the computer program may be embodied in hardware or firmware as opposed to software if desired, such alternate embodiments being well within the skill of the computer artisan.

Furthermore, it will be appreciated that the well-known Common Object Request Broker Architecture (CORBA) may be utilized consistent with the invention. CORBA provides a platform-independent, language-independent architecture for writing distributed, object-oriented applications. CORBA objects can reside in the same process, on the same machine, or on other local or non-local platforms. The Java language is in many respects highly useful for writing CORBA programs, as reflected for example in Java IDL, which implements CORBA capability.

Lastly, it is noted that although the examples and discussion in this disclosure relate primarily to hardware IP and VHDL, the methodology and apparatus described herein may be readily used in myriad other types of applications such as, for example, software or analogue hardware design.

Different types of data—Two types of data are stored within the aforementioned "configuration database" of the system. First, there is the data for driving the tools, including a description of the various components. This data then becomes an IP library from which the user selects the components which will design their system. Second, there is the data which describes an actual design created by the user. This data must describe what options the user has selected when building their design, this information being passed to the various tools.

Since these two types of data are often quite different, they are separately categorized into the 'IP Library' and the 'IP Project', respectively. The IP Library stores the component descriptions and data to drive the software tools. The IP Project, on the other hand, stores a user design, including extensions they chose and the options they selected.

Component based IP—The use of design 'components' that can be swapped in and out to form an IC design is at present broadly accepted and implemented. ICs are often designed to perform a specific task, and have well documented interfaces. Once the circuit is designed, the IC can be replaced with an IC from another manufacturer (as long as it is compatible with the interface).

However, this component-based concept has been extended to create so-called "configurable" IP. This allows the user to change the behavior of one or more components within the design to suit their needs more exactly. This newfound flexibility has many advantages, and also has many similarities to modern software practices, in particular component based software design.

For some years now, software engineers have been trying to speed up software development using components. It is no longer acceptable to create a complex application from scratch. It is often more efficient to build the application from standard software blocks, which can be plugged together in a development tool. These blocks can be libraries, DLLs, ActiveX controls, etc. For example, a developer who is creating an application with a calendar window would not want to code a completely functional calendar. Instead, they simply obtain a pre-existing or "off-the-shelf" calendar control which they place into their application.

However, the developer must also be able to customise such "off-the-shelf" components. In the foregoing calendar example, a specific color scheme or date display may be required. Furthermore, the secondary developer may then want to customise the control functionality. This sort of customization is relatively simple to provide, as long as the original or primary developer of the component anticipated the sort of behavior and attributes likely to be customized by the user in the first place, and provided "override" mechanisms for allowing such customisation in place of the defaults present in the component The foregoing example is analogous in many ways to the operation of the present invention. The ARC processor has similar capabilities, most notably, the extensible instructions and registers. For example, in the exemplary ARCtangent core, the cache size can be set to a desired size in a predetermined range (e.g., 0.5K to 32K). It is usually not generally known what custom instructions users may want to create when designing their core/IC. However, by providing a standard 'link type' for the core, developers can create and add any instruction they like. This type of extensibility is basically a way of overriding the default behavior of the core.

Types and Instances—The present invention further distinguishes between so-called "types" and "instances". The difference between types and instances is an important concept, which is very useful in the IP libraries and IP projects previously discussed. The concept is directly analogous to the difference between classes and objects in well-understood object-oriented programming terminology (i.e., type=class, instance=object). This distinction is described in greater detail below.

Types—Types are used to describe a class of object. For example, an exemplary ARCtangent processor would have a type definition which details how it is used and what components can be used to extend it. This definition is not an actual core, but just a description which applies to all devices of similar type (i.e., ARCtangent processors). A core type definition may include information about, inter alia, what clock speeds it supports, how to convert it into a VHDL or other hardware description language representation, how extensions can be connected to it, etc.

Instances—When the user tells ARChitect to create an ARCtangent core, they are creating a component instance. An instance of a core would contain information such as the register RAM type, or whether it has an instruction cache etc.

Figure 2:
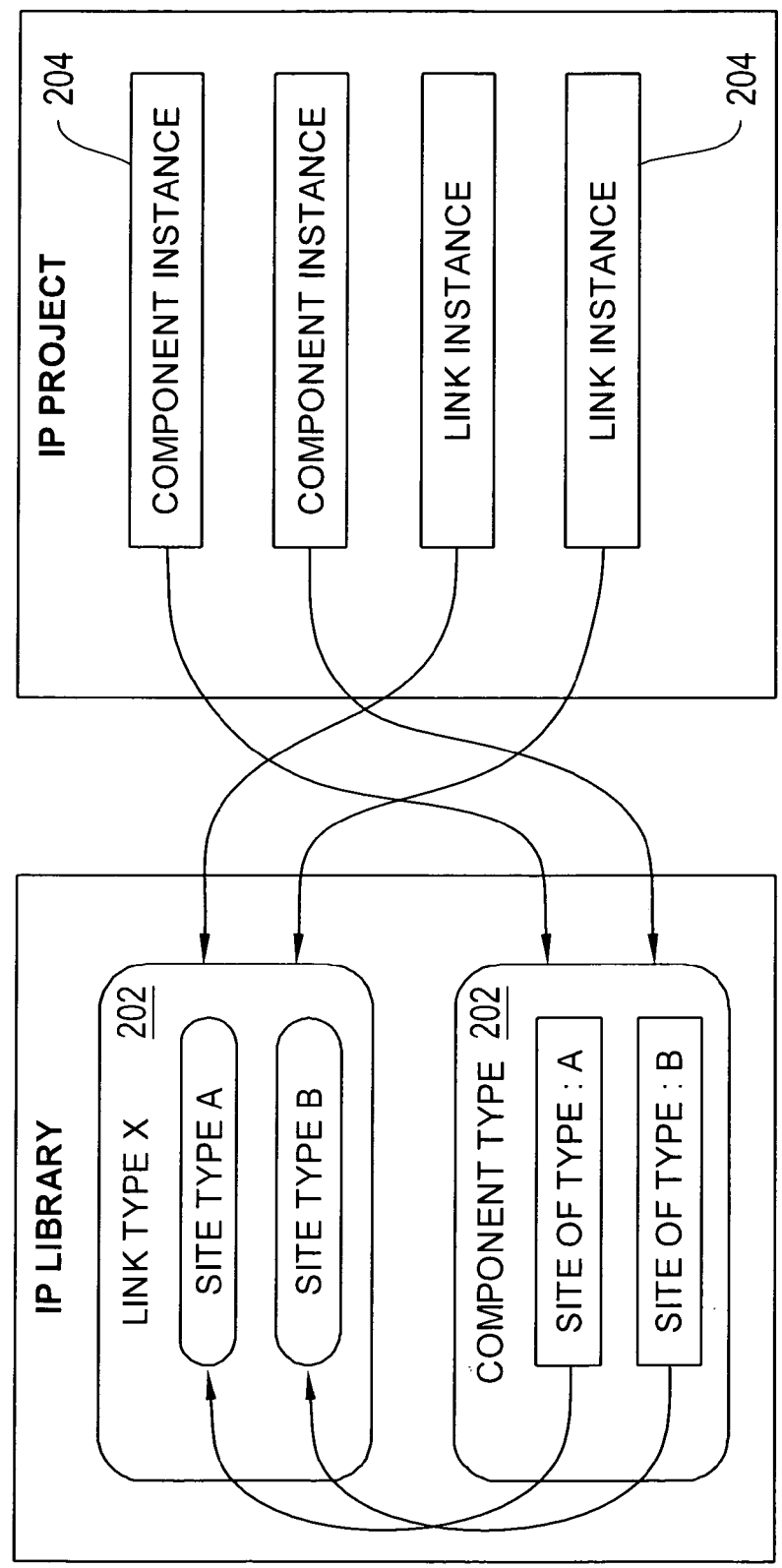
FIG. 2 is a graphical representation of the relationship between an IP Project and IP Library according to the invention.

There are three primary uses for types and instances in IP libraries and projects within the invention, namely components, sites and link types. These relationships are shown graphically in FIG. 2. In FIG. 2, "types" are shown as rectangles with rounded corners 202, and "instances" as rectangles with square corners 204. The dotted lines between the entities indicate an 'is an instance of' relationship.

IP Library—The IP library previously referenced holds all the information about the various components, site types and link types that can be used to create IC devices.

Figure 3:
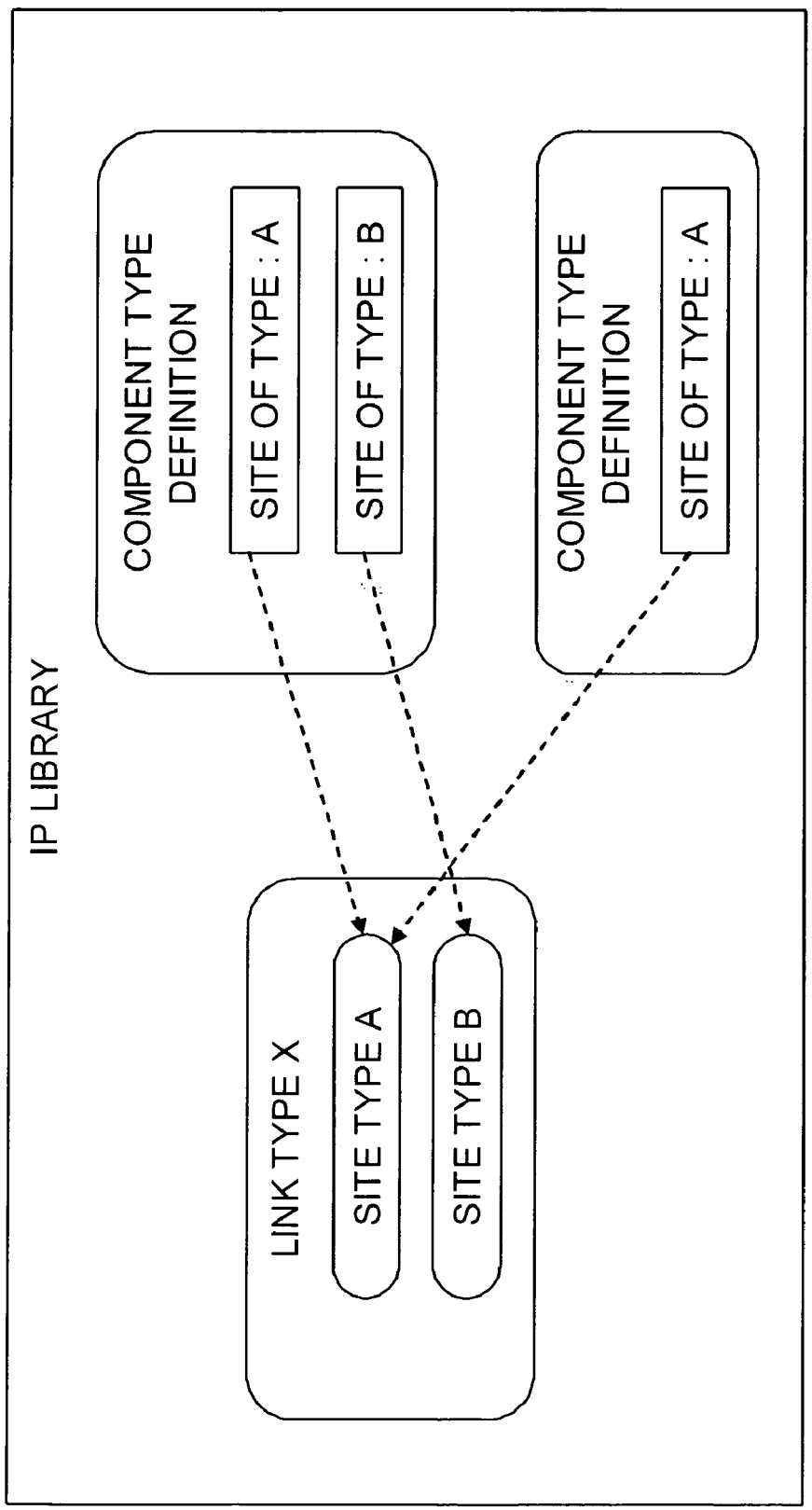
FIG. 3 is a graphical representation of an exemplary IP Library according to the invention.

Component Type Definitions—Component type definitions make up the bulk of the information in the library. They are definitions of the various components that can be used in the design. For example, the core, extensions, peripherals etc. will all have their own component definitions. Each component definition has its own subdirectory, which holds all the data for that component in one location. The main pieces of information that are used to define these components are their sites, and tool data. Sites describe how two components join together. The site used by a component will always be an instance of a site type definition stored in an IP library. FIG. 3 shows the relationship between site type definitions, component type definitions and link type definitions.

Link Type Definitions—Link types define the relationships between components. Each link type definition has its own subdirectory, which holds all its data including the definition of its site types.

Additionally, the present invention employs "plain English" link type designations. Typically, under the prior art, a link is described purely in terms of the components and sites that it links. e.g. Link1 connects 'core' (VHDL_Parent) to 'icache' (VHDL_Child). Clearly this does not tell the user anything very useful. A more useful description of the relationship would be:

'icache' inserts VHDL code into 'core'

Now the user can instantly determine the relationship.

This functionality is implemented in the present invention by putting information in the link type. Recall that the link type is the definition of all links of a particular type. In this case, there is a link type called 'VHDL' which has two ends 'Parent' and 'Child' (described in greater detail below). The information stored in the link type tells the program how to create a String based on an instance of that link type (in this case, the link that joins the core to the cache).

In the example given above, the code would be as follows:

Parent.getName( )+" inserts VHDL code into "+Child.getName( );

Information about the link is therefore encapsulated in the linktype so that the program does not have to discover information about it.

Templates—Templates are effectively IP projects stored in IP libraries. They have two main uses as follows:

1) Starting configuration—The exemplary embodiment of the software has several default set-ups or configurations, such as a "basecase" processor configuration (i.e., without any extensions yet added), DSP, general, etc. These configurations may be stored templates, and allow the user to choose an appropriate set-up from which to start their design.

2) Repeated configurations—If the user creates a part of their design which they want to replicate, they can store it in a template, and then instantiate it many times in their design.

Templates are described in greater detail below.

Encapsulation—One of the disabilities associated with the method by which tools have been rendered in prior art design systems is that there is no use of IP encapsulation. Stated differently, the information about a particular piece of IP in such systems can be spread out between many tools. For example, adding a new extension requires changes to many applications including the builder, debugger, compiler, simulators, etc. In fact, this information is frequently hard-coded into the source code of these applications. In addition, the rules on the use of the IP would also be hard coded into the tools.

The exemplary embodiment of the present invention described herein not only encourages encapsulation, it in effect forces it. Specifically, all information relating to a piece of IP is stored within (encapsulated by) the definition of that piece of IP. Each IP component 'knows' about itself and how it relates to others, but does not know anything about the other pieces of IP used in the design. For example, an extension instruction knows that it must be placed inside a core, but it knows nothing else about that core other than what is required to merge in its VHDL. This means that the core can be updated/replaced without impacting on the extension instruction.

For example, under a typical prior art solution, the designer would encounter dependencies in the build software GUI code such as the following:

You cannot have the XMAC without the memory sequencer in the core.

In the present invention, however, the XMAC and the core are treated as separate components, and the dependency is placed into the component it relates to (i.e. the XMAC in the above example). The dependency is made part of the XMAC component, and reads as follows:

This XMAC requires a memory sequencer.

In another aspect, consider the case where it is desired to store information indicating that the cache can't have a bus width greater than that of the core. This dependency clearly belongs to the cache, and therefore, we would put that data in the cache component type. In terms of encoding, the following might be used:

if the core bus with is greater than X, then print("cache bus width too small")

To accomplish this, it becomes clear that the core and the cache need to exchange information. Namely, the core needs to tell the cache what its bus width is. Hence, there must be a link between the core and the cache which transfers that data. There is such a link, and the cache refers to it as 'ICache_cache'. The actual definition of that link type specifies that the cache can ask for a variable called 'CoreBusWidth' from the other end of the link (namely the core). Therefore, to get the core bus width the Javascript would be as follows:

ICache_cache.BusWidth

Next, the cache must know what its own bus width is. This is taken out of the options data for the cache instance; i.e. id.options.BusWidth. Therefore, the dependency would be:

```
if (id.options.BusWidth>ICache_cache.CoreBusWidth){
    "Bus width is too small";
}
else{
    "Bus width is OK";
}
```

Build hierarchy—As previously described, the use of encapsulation demands that no one piece of software or component have all the code (e.g., VHDL). Each component has its own VHDL code only. Therefore, there must be a build process which is capable of taking VHDL from the different components and assembling it to make a unitary VHDL hierarchy of elements. The basic build architecture of the present invention is advantageously made quite simple, as follows:

1) Each component which has VHDL to build into the project has a VHDL_Child site.

2) Each component which wants VHDL from other components to merge into its own has a VHDL_Parent site.

3) When the sites are joined by links, a hierarchical tree of components joined by their VHDL sites is produced.

4) The builder queries the top most component for its VHDL code. This top-most component then tries to create the VHDL by reading in its own VHDL files and then merging in any VHDL from its children. The children may create their VHDL using a similar process.

5) The process is recursive as the build process moves down the tree. Each component reads its own VHDL from its component type, and merges in VHDL from its children.

6) When the VHDL code completes recursion and proceeds to the top of the tree, the build is complete and code from all the components has been merged together.

Note that the encapsulation used in the present invention also provides alternate methods for generating VHDL. Specifically, consider the case wherein a component does not want to generate its VHDL by reading it from disk; for example, a RAM component which generates its VHDL "on the fly" given a few basic parameters such as size and bus width, etc. In this case, there is no VHDL stored on disk, just a Java class which generates VHDL text as needed.

By extracting the build information from the tools, each component contains enough information to build it into VHDL. This enables the designer to distribute new extensions and peripherals without modifying any of the existing components.

It will be recognized that while the foregoing description is cast in terms of VHDL code, the same process may be applied to Verilog, C++, synthesis scripts, etc.

Hardware Hierarchy Generation—At the same time as the VHDL files themselves are generated the hardware hierarchy is also constructed from data stored in each component. The hardware hierarchy should not be confused with the component hierarchy, they are not necessarily related.

Each hardware component describes it's own hierarchy, this information being stored in a piece of tool data. The information is dynamic, being defined using JavaScript, as the hierarchy may change at design time, depending on the choices made by the user, e.g. builds intended to be run on ARCangel test hardware will often have additional hierarchy levels not present in a build for software simulation.

The component can specify as many hierarchy levels as it wishes. Each level can be one of three types, structural, behavioural or synthesissable. This is so they can be treated differently if necessary, dependent on other application settings. Notably structural levels describe hierachical levels that exist to connect possibly many other levels together.

Each level specified has an upper block name and one or more lower HDL blocks specified as belonging to that upper block. At build time the application creates one entry for each unique upper block name, and groups all lower blocks found in all components under that entry, thereby creating the final HDL hierarchy used to connect the components together and order compilation.

Data Hiding and Polymorphism—Encapsulation as used in this invention in effect means that a component can only know about itself and its relationships. However, this does not mean that components do not exchange information. Components are almost never used in isolation, and therefore, must convey some information to one another. However, if a piece of data is required by one component from another, then that fact is made part of the definition of the components. Typically this is accomplished using link types and sites (discussed above, but essentially the same as interfaces in Java in the illustrated embodiment). If there is a relationship between two components, then a link type is defined for that relationship. Information is then added to that link type to specify what information is transferred across it. Note that the link type specifies only what type of information is transferred, not what the information is, or how it is generated. It is up to the creator of the IP to decide how that information is created.

Libraries and Projects—As previously discussed, the data is split into object instances and types. The instances are the actual IP components the user places into a design, and the types are the meta-data descriptions of those object. This is analogous to classes and objects, respectively, in Java/C++. Types are stored in IP libraries, and instances are stored in IP projects. Note, there are not only component types stored in the library, there are also link types. Similarly, a project also contains link instances.

Figure 4:
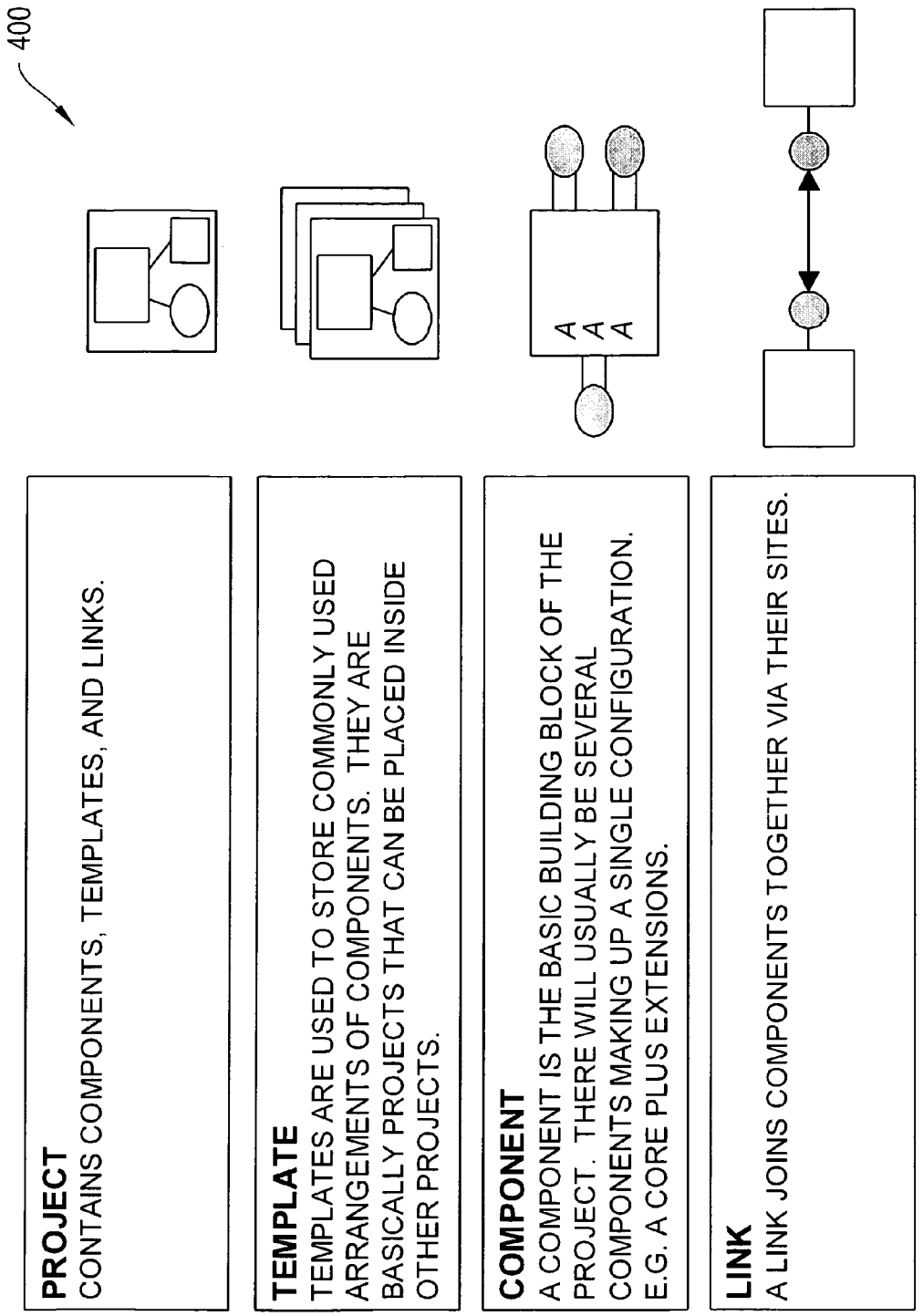
FIG. 4 is a graphical representation of the various structures used in creating a design according to the present invention.

IP Project—Referring now to FIGS. 4-7, an exemplary IP project according to the invention is described. FIG. 4 shows the primary structures which make up an IP project 400. These structures are arranged in a hierachy 500 which is shown In FIG. 5. A project consists of a number of components and templates joined by links. FIG. 6 shows the directory structure 600 of a typical project.

Figure 7:
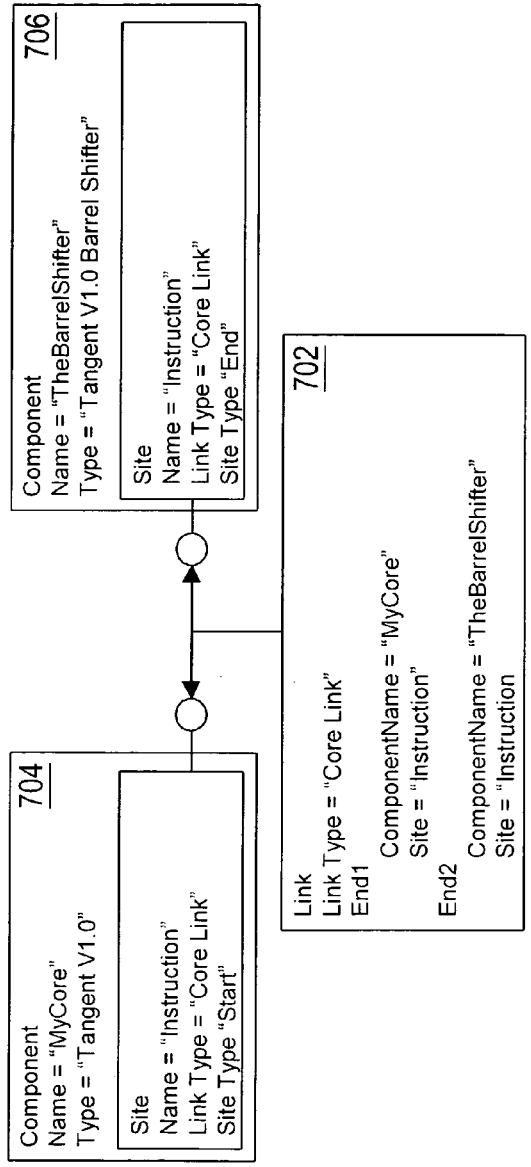
FIG. 7 is a graphical representation of an exemplary link joining two design components.

Links—Links are used to join sites together and, therefore, join components together. FIG. 7 shows an exemplary link 702 joining two components 704, 706. A link in the present embodiment stores the names of the two objects it links and the names of the link sites within those objects, although they may also be configured to store additional types of information if desired.

Figure 8:
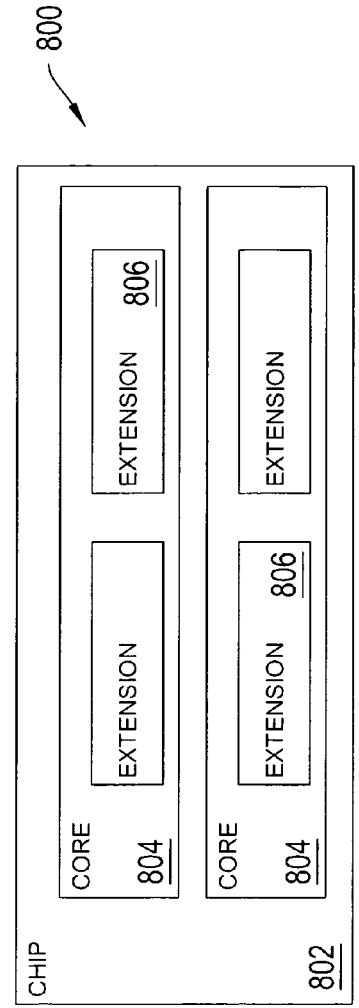
FIG. 8 is a graphical representation of an exemplary component hierarchy.

Parent and Child Components—In a system design, there is nearly always a hierarchy of components, some as "parents" or "children" of others. As used herein, the terms "parent", "child", and the like merely refer to the hierarchical origination or coupling between components. For example, a core component is considered to be the parent of its extensions, and a chip-level component would be the parent of the cores. Such a block-based design mirrors both the way the VHDL is written and SOC design. FIG. 8 illustrates a typical component hierarchy 800.

As can be seen in FIG. 8, at the highest level is the chip component 802. A chip contains two cores 804 (the chip is the parent of the cores). Each core is also a parent, and has two extension components 806 each. There is no limit to how deeply these parent-child relationships can be nested, but each component can generally only have one parent component.

Blank Components—Sometimes it is useful to group components together to hide the implementation details, but there is no obvious parent component. In this case, the user can create a blank component to act as a container for the objects. A blank component is the simplest possible component, with no variables or-sites of its own.

Figure 9:
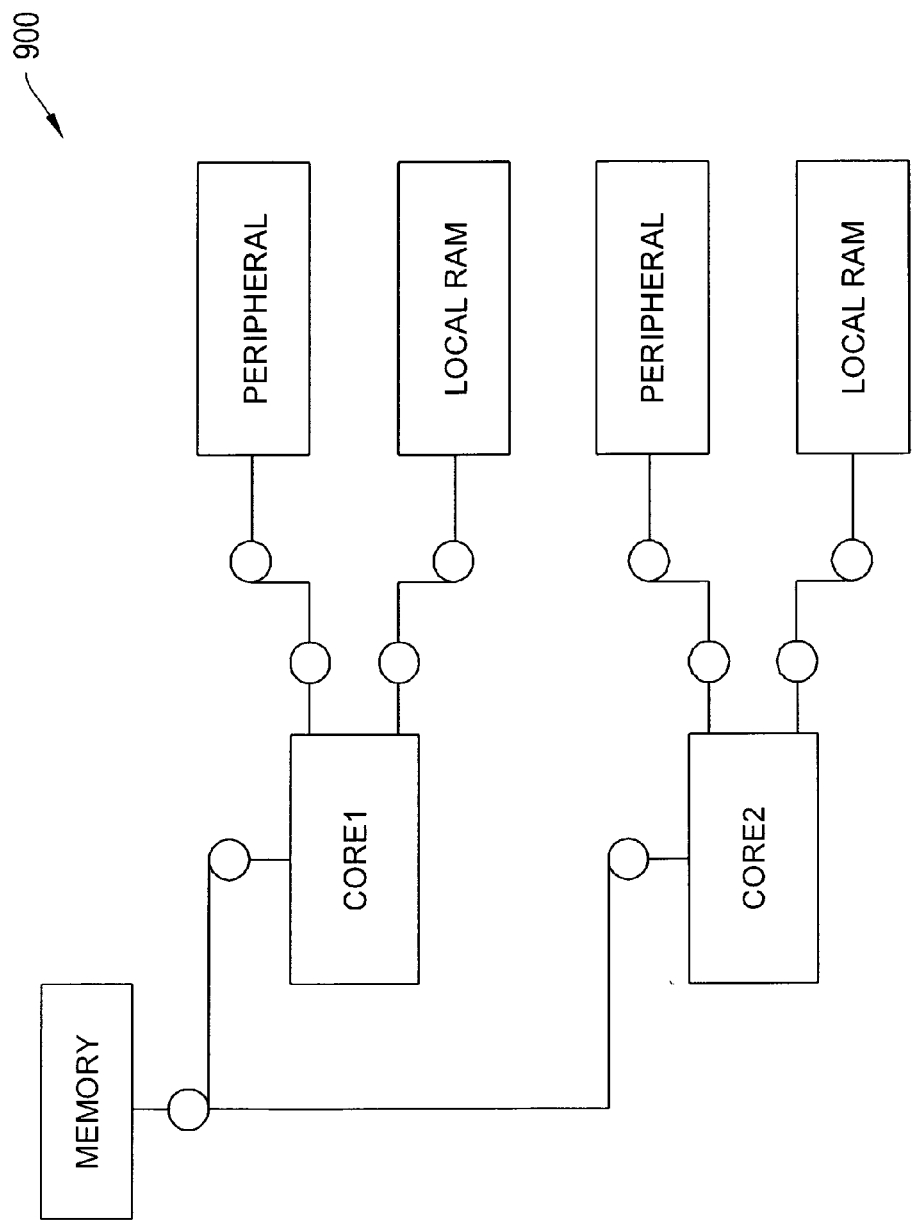
FIGS. 9-9c are graphical representations of complex systems with various views of the grouping of components.
Figure 9A:
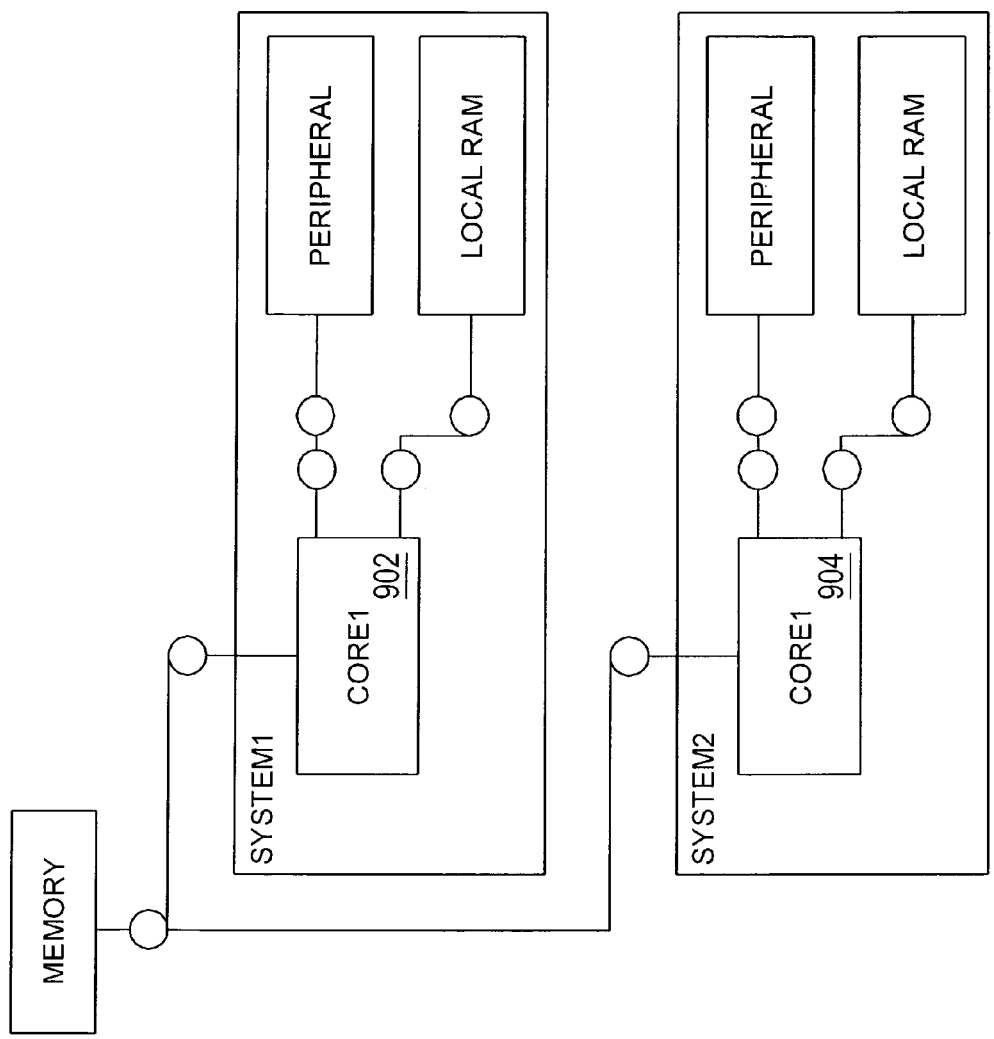

FIG. 9 illustrates a complex system 900 without grouping of components. As shown in FIG. 9a, the cores 902, 904 can be grouped with their peripherals and local memory using blank components. After such grouping, the user would be able to view the design at the system level, which would show the memory and the two blank components, which they have named 'System1' 910 and 'System2' 912 (FIG. 9b). The user they could 'zoom in' to one of the components to show that it is made up of a core 920, a peripheral 922 plus some local RAM 924 (FIG. 9c).

The user would typically split their design into logical blocks (components) that can then be developed separately. For example, their design may include two cores that perform quite different tasks. These cores are separate components, and can therefore be developed by different teams. Typically, the cores would require their own extension instructions, tailored for their specific tasks. These extensions would be defined by the different teams and held in IP libraries. The definitions of the new extensions could be made part of the cores that use them. Therefore, the core components may contain their own libraries with their extensions inside them, as shown in FIG. 10.

Figure 10:
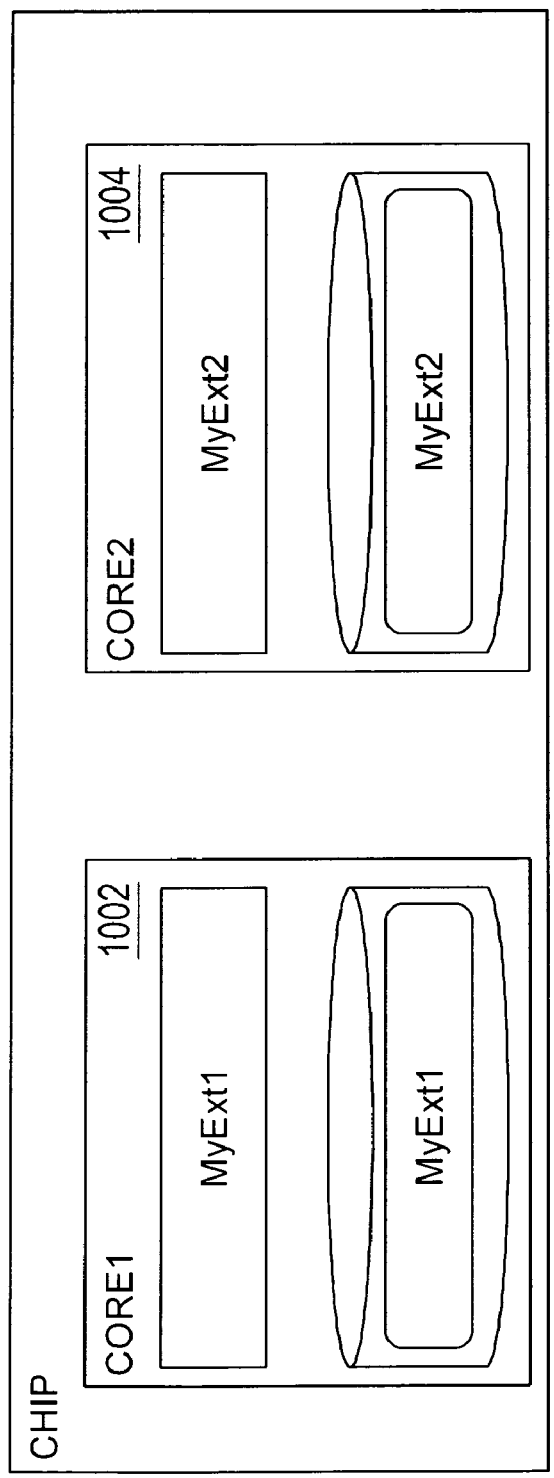
FIG. 10 is a graphical representation of exemplary cores with components having their own libraries and extensions.

In the example of FIG. 10, the two exemplary extensions, MyExt1 1002 and MyExt2 1004, are only visible from within their respective cores. So, Core2 would not be able to create an instance of MyExt1, because the latter is not in scope. Similarly, Core1 could not instantiate MyExt2.

Again, the user is encapsulating all information about a component and storing it together in one place. This approach advantageously enables the user to move a component from project to project and to have the associated component type definitions move with them.

Scope Rules—Placing libraries inside components dictates that there must be some rules that govern their visibility ("scope rules"). The rules are set forth generally as follows:

- A library can be seen by its parent component. This means that the component that houses the library can use it.
- A library can be seen by its parent component's children. If the component housing the library has children, then they can also use it. This visibility extends to grandchildren, great grandchildren, etc.
- A global library can be seen by all components. Some libraries are global, and do not belong to a component. These are visible to all components.

Figure 11A:
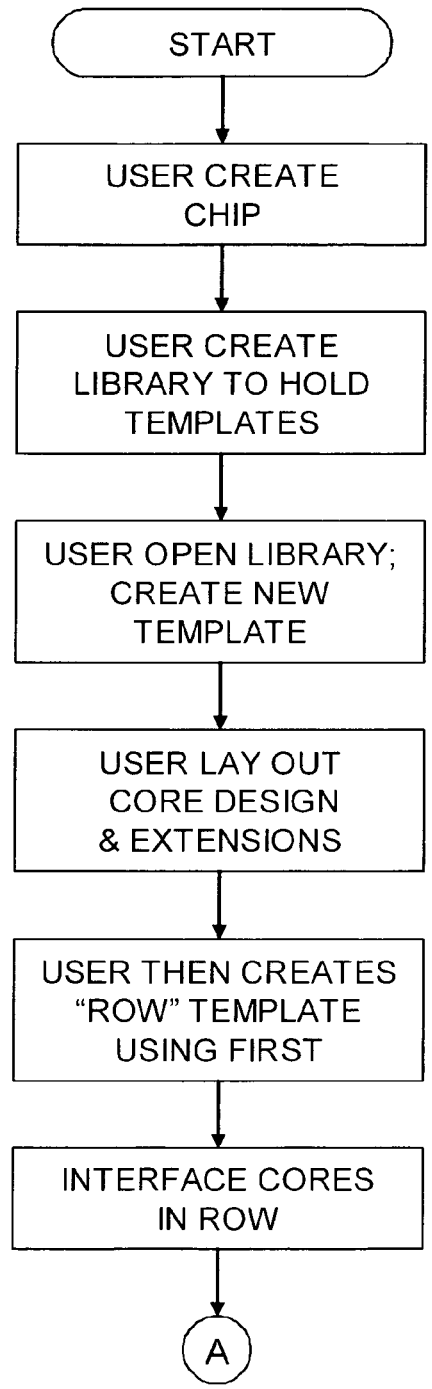
FIGS. 11A and 11B are logical flow diagrams illustrating the method of generating a multi-core IC design according to the invention.
Figure 11B:
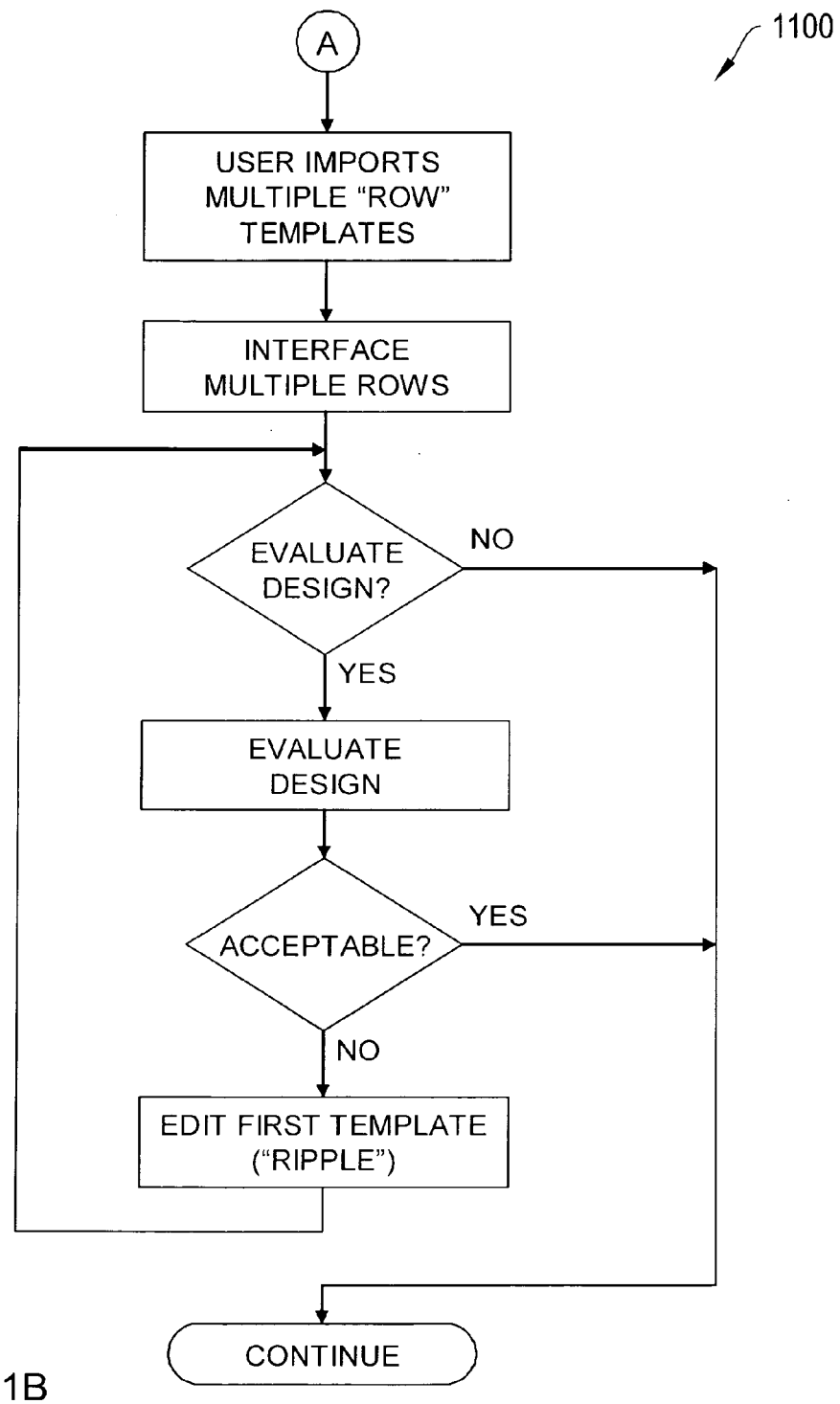

Templates—One of the main aims of the present invention is to make it scaleable. Specifically, such scalability allows the software to represent single core systems, small multi-core systems, or very large multi-core systems. This scalability is largely due to the aforementioned templates. These templates allow the user to design some commonly used layouts of components, and then place these into IP libraries for subsequent use. For example, an ARCtangent core linked to a USB controller and some shared memory may comprise a template. The user can then use that template in a new chip by simply creating a template instance in their design. Templates also provide a good way of creating very large systems, with 10s or 100s of components. For example, a chip design in which 100 identical processors are arranged in 10 rows of 10 may be created according to the following methodology, as shown generally in the exemplary embodiment 1100 of FIG. 11.

Figure 12:
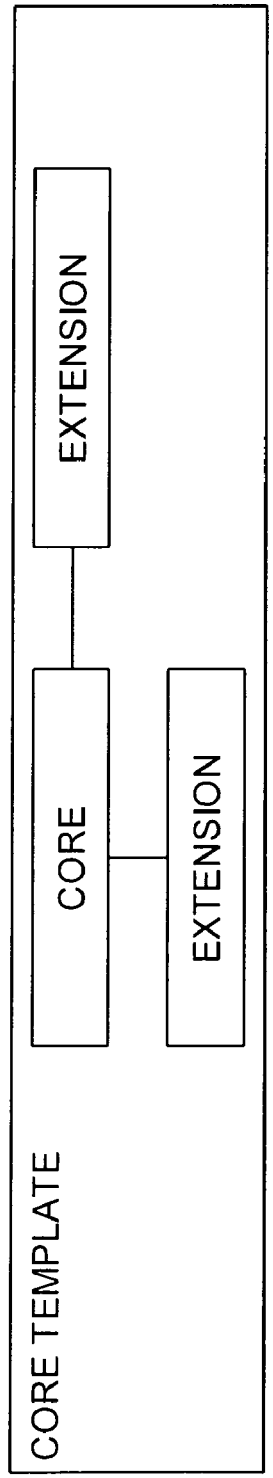
FIG. 12 is a graphical representation of an exemplary core template.

First, the user creates a chip which will eventually hold the entire 100 processor design. The user creates a library inside the chip component to hold the templates. Next, the user opens the library and creates a new template, and lays out a simple design with the core and the extensions they require. This design will be the template from which all 100 cores will be created. See FIG. 12.

Figure 13:
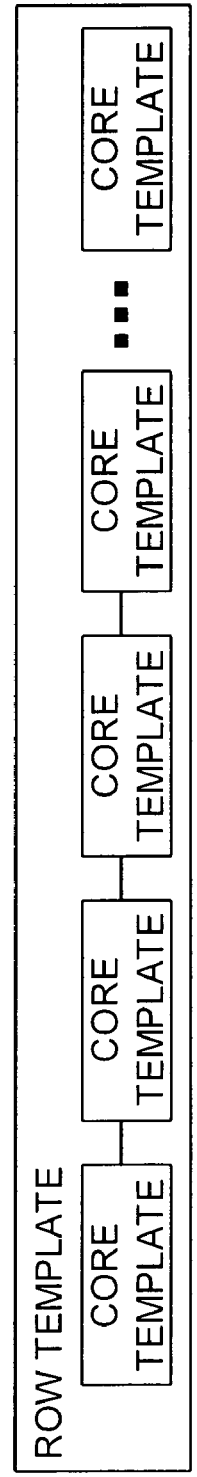
FIG. 13 is a graphical representation of an exemplary row template.

Once the core template is complete and saved, the user then creates another template in the library. The core template they created in step 2 above is now available for use, and they can use 10 of them in their design to create a row of ten processors. The processors are interfaced to each other as required, and the new template saved in the library. See FIG. 13.

Figure 14:
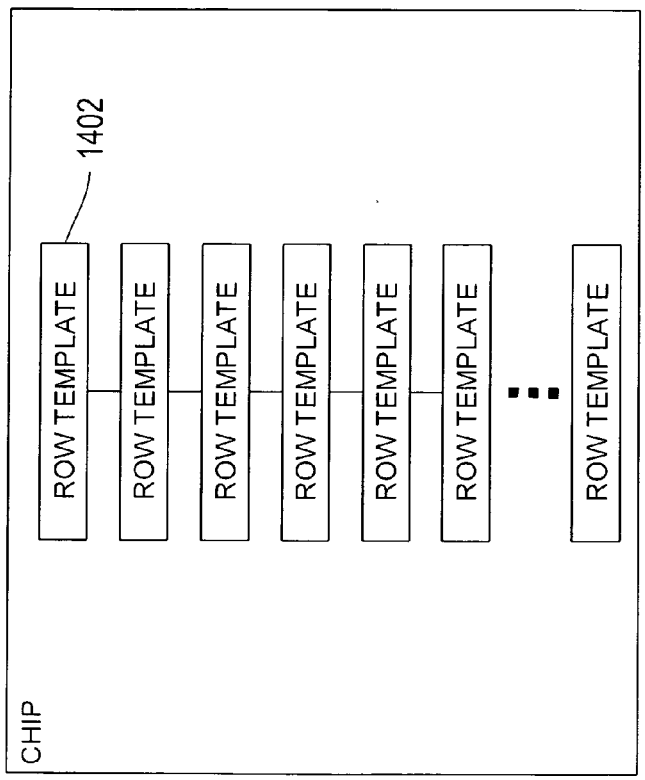
FIG. 14 is a graphical representation of the multi-core IC of FIGS. 11A and 11B.

The two new templates are now available for use in their design. The user then imports 10 processor rows 1402 into their design, and connects them as required. A design with 10 rows of 10 identical processors is now created. See FIG. 14.

Lastly, if the user wants to change the processor set-up they are using, they can simply edit the original core template and the changes will "ripple" through the row template and project, thereby obviating the requirement for the user to modify each core component (or row component) individually.

There are three primary ways in which a template can be used in a design. First, the user may choose a template as a starting point from which they build their design. In this case, the information from the template project would be copied into their design, and they can then modify it.

Second, they may wish to add a template to an existing design and then modify it. For example, if they already have a processor core in their design, and they want to add another (based on the DSP template), this is readily accomplished. In this case, the template project information is copied directly into their project, and the user is then free to modify the new core to suit their needs.

Lastly, the user may be using templates to replicate large structures in their design (as in the previous 100-core example). In this case, they would not want the template information to be included in their design, but rather only a reference to it. This approach allows the user to update the template without having to recreate their design. Since only a reference to the template is stored in the project, the user cannot modify one template without changing all the others of that type.

IP Library Usage—As previously described, the IP libraries of the present invention are repositories for information about component types, link types and templates. There must be at least one library on the user's system, but there is no maximum number that can be employed in a given design. The present embodiment utilizes a system-wide environment variable that holds a list of directory paths. This exemplary variable is called ARCLIB, and allows the IP Library application programming interface (API) to find all of the global libraries that the designer uses. Furthermore, data in one library can reference data in another. For example, the ARC library provided with the system tools includes a number of link types that will be referenced by component types in other libraries.

Figure 15:
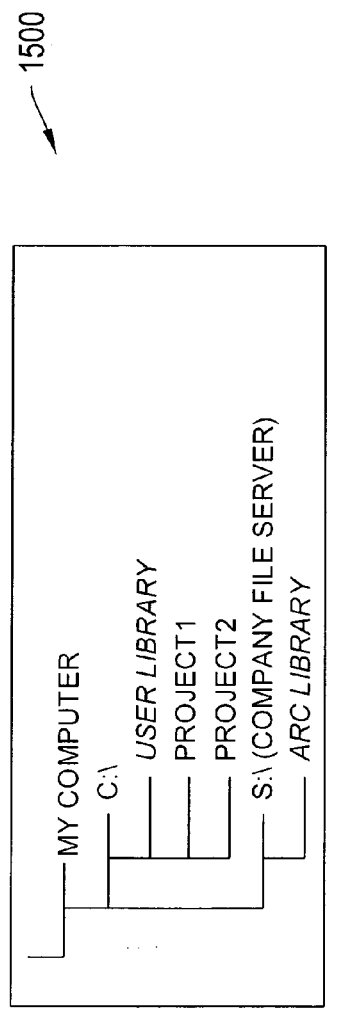
FIG. 15 is a graphical representation of an exemplary local machine directory structure.

It is envisaged that most users will use one or two libraries only. For example, there might be a main library for use by all engineers in a given organization. Such main library for a company might include the standard processor core offering plus any other IP that the company has licensed. The other library could be configured to hold components that the engineers are working on at the time. Their local machine may be configured as shown in FIG. 15. In this example configuration 1500, C:\ is their local hard drive, and S:\ is a network drive shared by all developers. The processor core library is stored on the network drive, and therefore can be used by all developers. This allows the library administrator to instantly add new components or bug fixes. On the local drive is their user library for all their own components which they don't want to be accessible company-wide.

The aforementioned ARCLIB environment variable is configured in the illustrated embodiment to hold the following directories:
    S:\ARC Library
    C:\User Library

[Note that the directories Project1 and Project2 are IP projects.]

Figure 16:
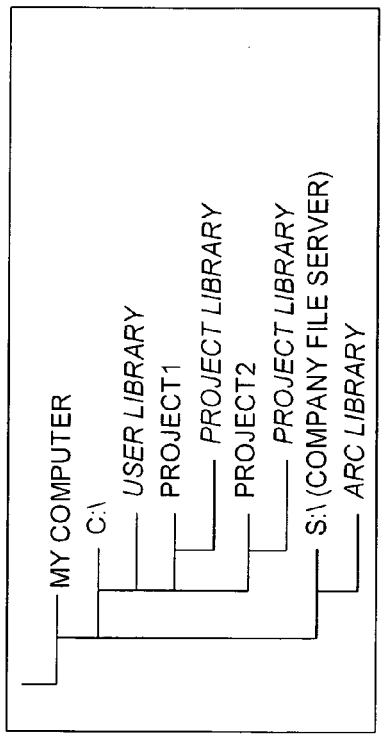
FIG. 16 illustrates another exemplary configuration having multiple libraries for multiple projects.

A more experienced user may have a library for each project they work on, so that the components they develop (e.g. an extension instruction) for a particular project would be part of the IP project. The IP management tools allow the user to transfer those components to one of the other libraries if desired as well. One exemplary advanced set-up is shown in FIG. 16.

Again, the S:\ drive on the users computer is a network drive, so it would be shared by all users, and it is used to host the company-wide library (e.g., ARC Library). The C:\ drive is the users local hard drive, and is therefore used generally to store anything that is not shared. The particular user of the illustrated example has created a User Library where they keep all their useful extensions and templates. In addition to the user library, they also have two projects which they are working on at present; Project1 and Project2 (these are IP projects). As part of these projects, the user has created some custom extensions to the ARC, and therefore, they have created libraries to store them in. These libraries are stored in the IP project directories, and are therefore local to the project.

The ARCLIB environment variable would hold the following directories:
    S:\ARC Library (Absolute path)
    C:\User Library (Absolute path)

In addition to the global libraries, each project has their own local library. So, the total list of libraries for use with Project1 would be as follows:
    S:\ARC Library (Absolute path)
    C:\User Library (Absolute path)
    Library (Relative path)

Similarly, for Project2:
    S:\ARC Library (Absolute path)
    C:\User Library (Absolute path)
    Library (Relative path)

Note that the last library in each list is a relative path, which allows the user to move their project without having to edit the path to the library. Although both projects use a library called 'Library', they do not refer to the same one as this path is relative to the project path.

Figure 17:
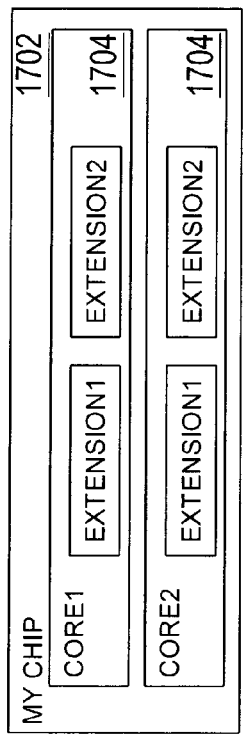
FIG. 17 is a graphical representation of an exemplary chip component of a design project, containing two cores.

IP Project Usage—An IP project is simply a component that has been saved to disk. However, as has been previously described, components can contain other components, so saving a single component to disk will also cause its children to be saved (and their children etc.). In the illustrated embodiment, each parent component is stored as a subdirectory on the hard drive, which means that the resulting directory structure parallels the project structure. For example, the following diagram shows a simple project. At the highest level is a chip component 1702, which contains two cores 1704, as shown in FIG. 17.

Figure 18:
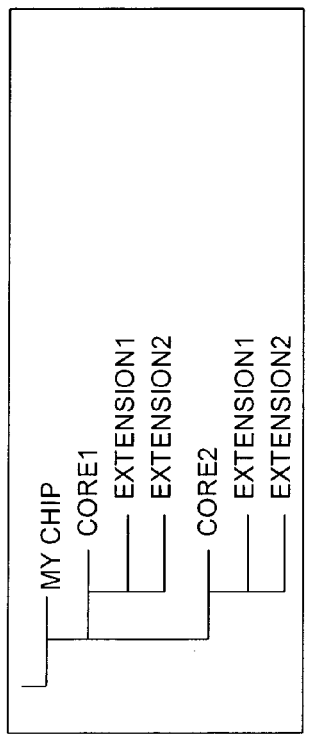
FIG. 18 graphically illustrates an exemplary directory structure for the design project of FIG. 17.

FIG. 18 illustrates an exemplary directory structure 1800 for the My Chip project. As can be seen, all components which are parents, have their own subdirectory. Hence, in the example, the chip and the cores both have children, so they have their own subdirectory.

Clearly, an IP library can be contained in a project in any of the component subdirectories. This is how a component can have its own IP library associated with it. In the above example, the designer might create their own extension for use in Core1. Therefore, there would be a library contained in Core1 to hold the component type definition, as shown in FIG. 19.

Figure 19:
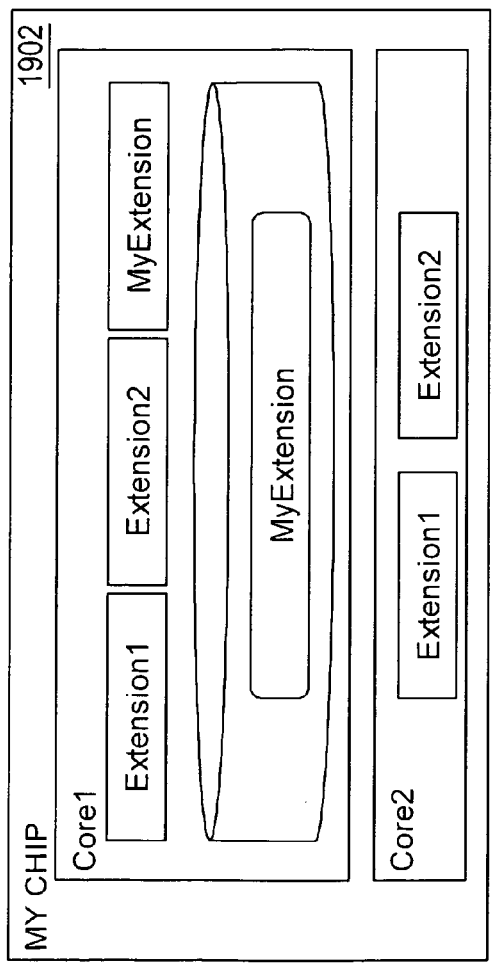
FIG. 19 graphically illustrates the use a library inside Corel to hold the design of a new extension.
Figure 20:
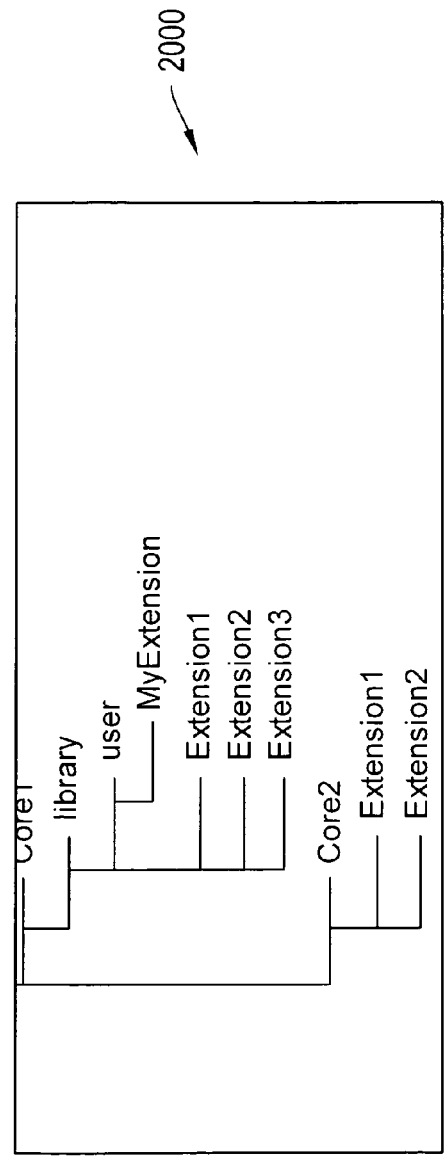
FIG. 20 is a graphical representation of a directory structure for the project of FIGS. 18 and 19.

As illustrated in FIG. 19, the user has created a library inside Core1 1902 to hold the design of their new extension. Once they have designed the new extension, they have then used it in the core by instantiating it. This project would have the directory structure 2000 of FIG. 20.

Figure 21:
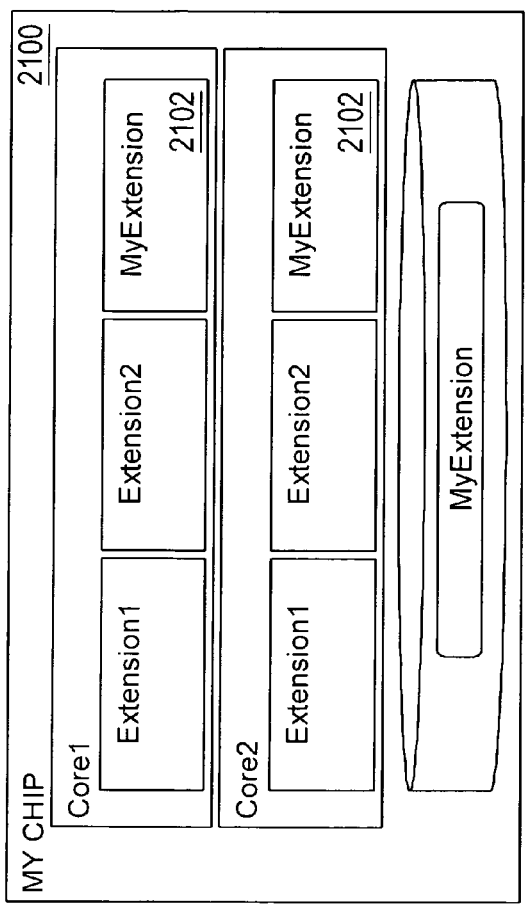
FIG. 21 graphically illustrates an exemplary project having two extended cores.

It is quite possible that the designer would decide that the extension should also be used in Core2 as well as Core1. In order that the extension could be used in both cores, the designer would have to put the extension into a library which is visible to both cores. The obvious (but not only possible) place for such a library is in the My Chip component 2100, as shown in FIG. 21. Now, the MyExtension component definition 2102 is visible inside both cores.

The aforementioned parent-child relationships of the invention (as well as other similar relationships) allow the designer to split their project into logical blocks, with each block considered as a separate sub-project. The term IP project as used herein refers to a component saved in a storage device (e.g., hard drive), and can therefore refer to any component stored on the user's hard drive. Typically, an IP project consists of one chip component, the chip component containing one or more cores, the one or more cores each (potentially) containing one or more extensions, and so forth.

Development Systems

The following discussion provides description of the use of libraries and projects in various exemplary development systems. A development system includes, for example, development tools such as the foregoing design software (e.g., "ARChitect",) compiler, debugger, etc., as well as IP management tools and the various libraries. It will be recognized that the following descriptions are merely exemplary in nature, and do not represent the totality of different development systems or combinations of components thereof which may be utilized consistent with the present invention.

It is noted that some of the development systems detailed below make use of so-called "source code control systems" (SCCS). These systems are often critical for building large complex systems, especially when several developers are working on the same set of files concurrently. As an example, so-called "test-and-wait" function (such as a semaphore) that will wait for the desired resource may be utilized to implement the SCCS. As is well known in the art, a semaphore is a mechanism that is used to signal the availability of a resource. One or more processes may wait indefinitely for a resource semaphore to signal availability. Alternatively, a queue may be used to implement the aforementioned test and wait functionality. The term "queue" refers generally to an entity for interprocess communications and allows messages to be passed between application portions on a distributed system. A given process can therefore post messages to any other process that creates its own queue. Many variations of interprocess queues are well known to those of ordinary skill in the art. Specific implementations of source code control systems are generally well known to those of ordinary skill in the programming arts, and accordingly not described further herein.

It is anticipated that as processor core and SoC systems become more complex, the user will need an SCCS to manage their projects. To facilitate this integration, the IP libraries and IP project formats of the present invention allow logical sections to be checked in and out individually. Source code control systems are designed to work with files (usually text files). For example, a check-in/check-out operation will normally work on individual files, or a whole subdirectory. Therefore, logical structures in the libraries and project benefit from being stored as a single file or subdirectory. For example, a multi-core project with many cores will be best implemented if each core and its extensions are stored as a file or subdirectory. That way, a user may "check out" a core to work on, while another user works on a different one. This would not be possible if all cores were stored in the same file.

Figure 22:
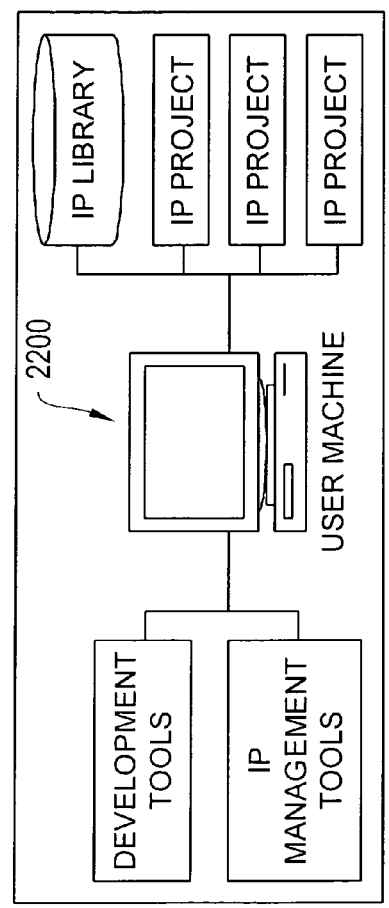
FIG. 22 is functional block diagram illustrating an exemplary single user development system according to the invention.

Single User Development System—FIG. 22 illustrates an exemplary single user development system 2200 according to the invention. Attributes of this system include (i) a single user; (ii) a single IP library; (iii) multiple IP projects, and (iv) no source code control system. This is the simplest instance of an IC development system. The user works alone on various projects.

Figure 23:
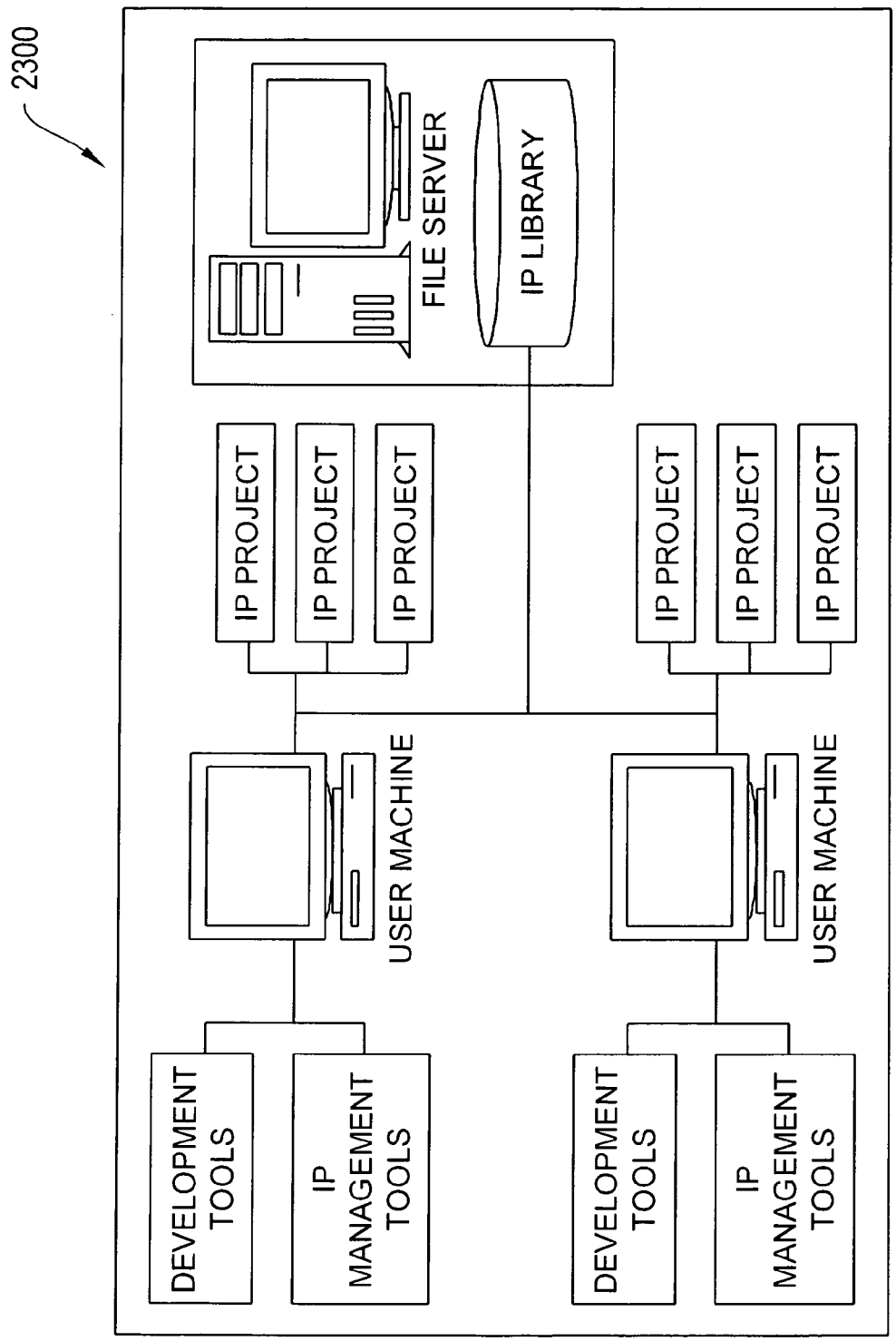
FIG. 23 is functional block diagram illustrating an exemplary multiple user development system with (i) multiple users; (ii) single IP library; (iii) multiple IP projects; (iv) no source code control system.

Multi-User Development System—FIG. 23 illustrates an exemplary multiple user development system 2300 with the following attributes: (i) multiple users; (ii) single IP library; (iii) multiple IP projects; (iv) no source code control system. In this embodiment, several users develop different projects, but use one (or a limited number of) library of component type definitions. Therefore, there is a shared IP library (used by all users), but local IP projects.

Figure 24:
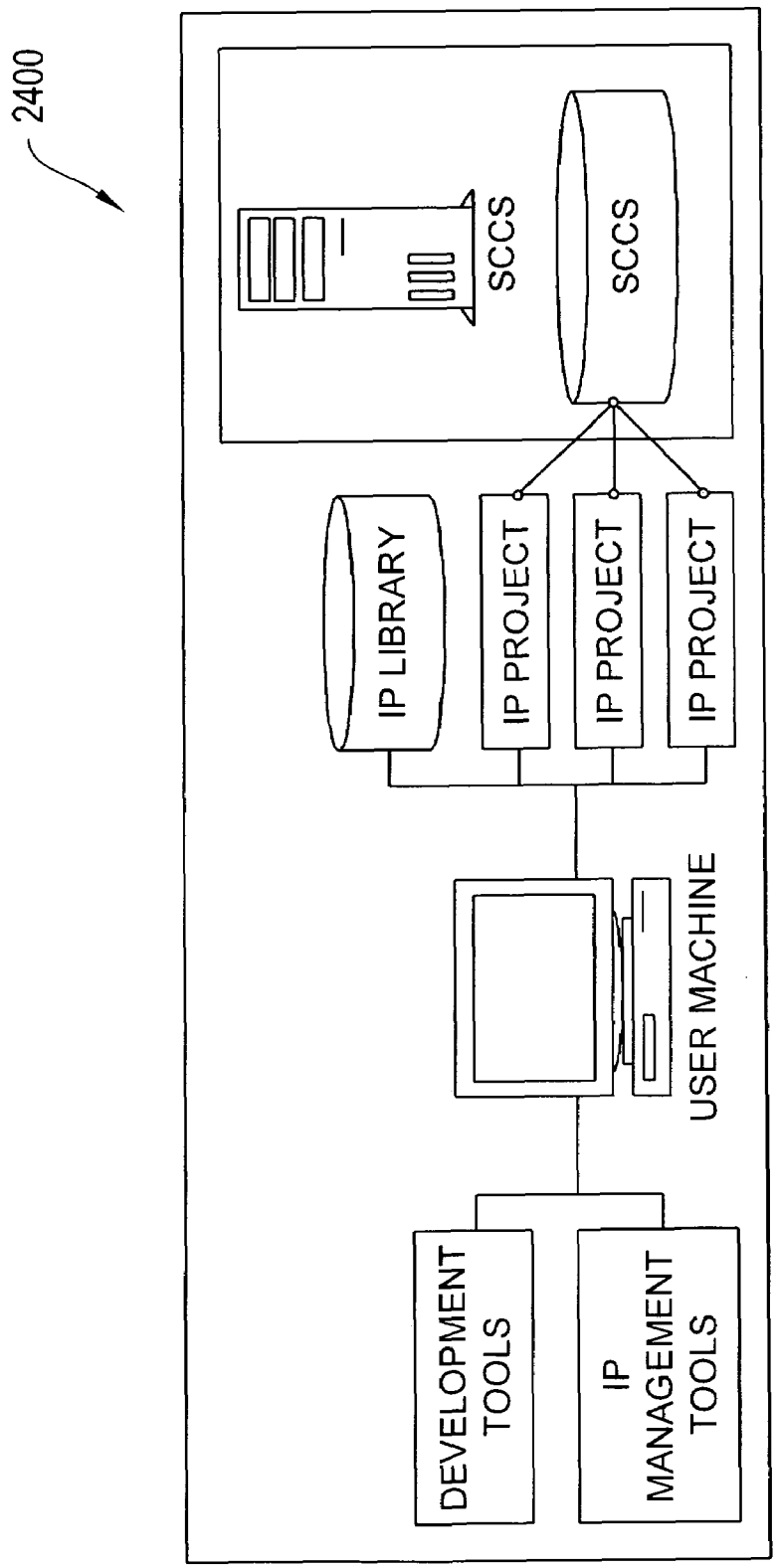
FIG. 24 is functional block diagram illustrating an exemplary single user development system with SCCS.

Single User Development System With SCCS—FIG. 24 illustrates an exemplary single user development system 2400 with SCCS. Attributes of this system include: (i) single user; (ii) single IP library; and (iii) multiple IP projects stored in source code control system (SCCS). This embodiment is the same as the single user embodiment previously, but with the introduction of a source code control system to manage the project. When developing any complex system, it is adviseable to use a source code control system. This enables the user to perform all of the normal SCCS functions on the IP project; e.g. version control, check in, check out, branching etc.

Figure 25:
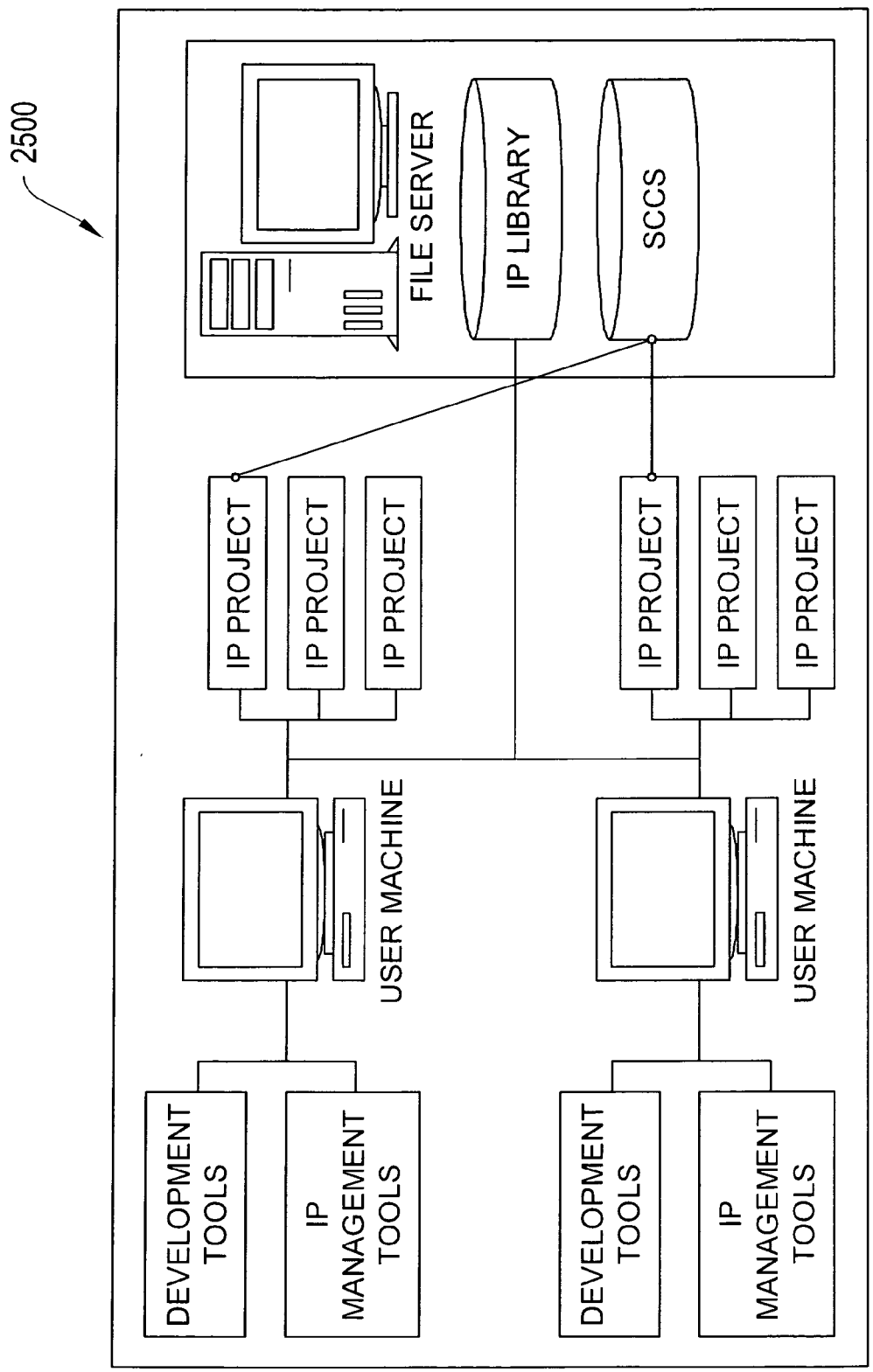
FIG. 25 is functional block diagram illustrating an exemplary multi-user systems with SCCS.

Multi-User Development System With SCCS—FIG. 25 illustrates an exemplary multi-user system 2500 with SCCS. Attributes include: (i) multiple users; (ii) single IP libraries; and (iii) multiple IP projects stored in source code control system (SCCS). This embodiment illustrartes how multiple users can work on the same projects at the same time using a conventional source code control system. In this case, there is one project which is stored in the SCCS, but checked out locally to the machines of the respective users.

Figure 26:
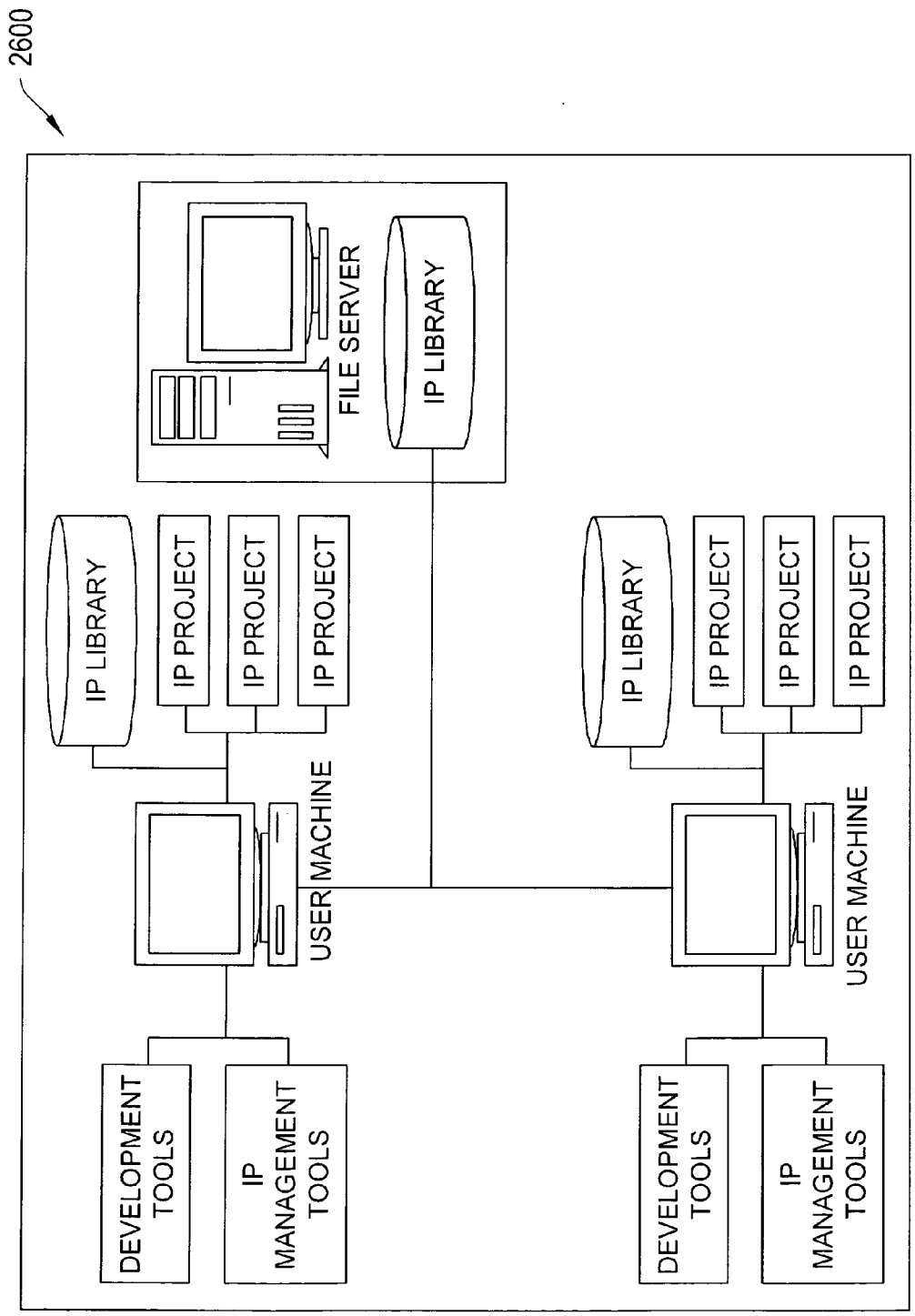
FIG. 26 is functional block diagram illustrating an exemplary multi-user, multi-library development system.

Multi-User Development System With Multiple IP Libraries—FIG. 26 illustrates a multi-user, multi-library development system 2600. Attributes include (i) multiple users; (ii) multiple IP libraries (some local, some shared); (iii) multiple IP projects; and (iv) no source code control system.

Each of the embodiments of FIGS. 22-25 have only one IP library, sometimes shared between multiple users. However, there are times when the user may wish to create their own components, or modify existing ones, and place these new pieces of IP in an IP library (FIG. 26). In the embodiment of FIG. 26, the two (or more) users share one IP library which would typically hold the major components (cores, extensions etc). They also have their own libraries stored locally which would hold customised components for use in their own projects. It may well be that some of their own components stored in the local libraries are worth using throughout the organization, such as by other developers working on other different but related projects, in which case, they would be transfered to the shared library.

Figure 27:
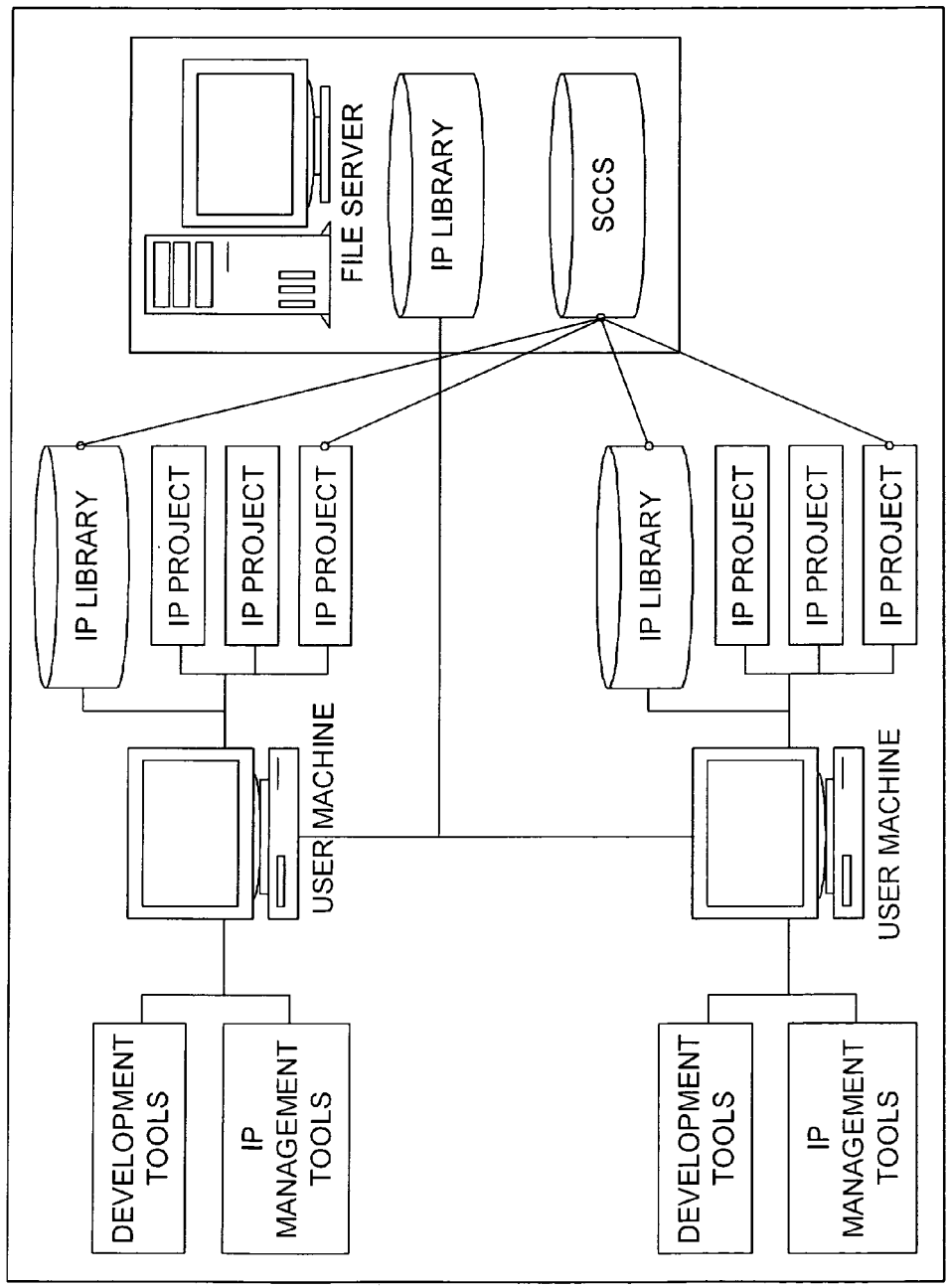
FIG. 27 is functional block diagram illustrating an exemplary multi-user, multi-library system with SCCS.

Multi-User Development System With Multiple IP Libraries And SCCS—FIG. 27 illustrates an exemplary multi-user, multi-library system 2700 with SCCS. Attributes include: (i) multiple users; (ii) multiple IP libraries, some local, some shared; (iii) multiple IP projects; and (iv) SCCS. This embodiment is similar to the previous one, except that the two users are working on a shared project and a shared IP libraries, both of which are stored in the SCCS.

Figure 28:
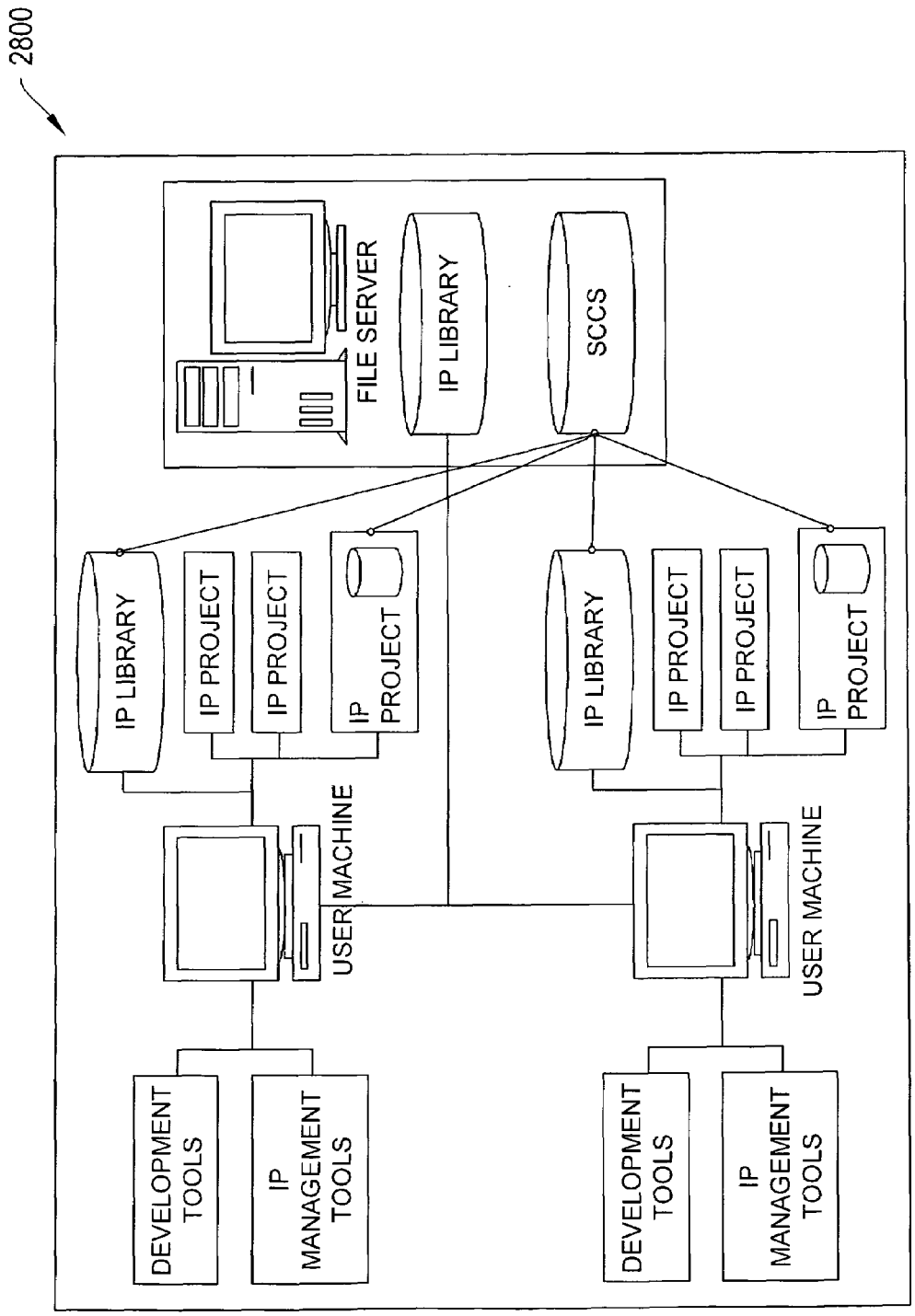
FIG. 28 is functional block diagram illustrating an exemplary multi-user, multi-library, multi-project development system.

Multi-User Development System With Multiple IP Libraries, Project Libraries And SCCS—FIG. 28 illustrates an exemplary multi-user, multi-library, multi-project development system 2800. Attributes include: (i) multiple users; (ii) multiple IP libraries (some local, some shared, some local to projects); multiple IP projects; and (iv) SCCS. This embodiment incorporates the concept of having libraries as part of projects. The two (or more) users use the global IP libraries stored on the file server, plus their own local libraries. In addition, one of the projects they are working on requires some project specific components which they have created. These components are stored in a library, inside the IP project.

Library Directory Formats

The directory structure of IP libraries in the exemplary embodiment of the invention is based primarily on the package structure of Java., although other approaches (and languages) may be utilized. The exemplary directory structure scheme mirrors the underlying directory structure, and is based on package names separated by periods or "dots". For example, in Java, the class 'com.arc.architect' would be found by looking for the file 'architect.class' in the directory '\com\arc'. The depth of the directory tree is not limited, so a developer can group his/her classes in any way they like. However, if the names of packages are not to conflict, the highest-level packages should be named accordingly. One naming approach employs naming packages after the reversed company URL (without the 'www'). For example, the ARC web site is at 'www.arc.com', so the reversed URL is 'com.arc.www'. Next, the 'www', is deleted which leaves 'com.arc'. Therefore, the top two package names used for any Java classes from ARC should be 'com' and 'arc'. Therefore, example classes might be as follows:

com.arc.architect com.arc.builder.filereader com.arc.ipmt.gui.componenttree

Figure 29:
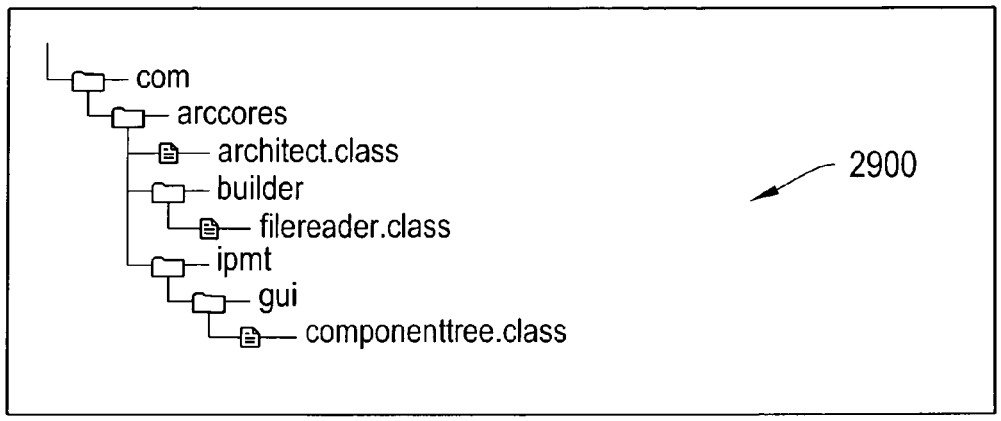
FIG. 29 illustrates class storage in an exemplary directory structure according to the invention.

These classes would be stored in the directory structure 2900 shown in FIG. 29.

Java—In the illustrated embodiment, the well known Sun Microsystems "Java™" language is used to not only implement the software embodying the invention, but also as an integral part of the IP model itself. As previously described, one architecture of this "IP model" incorporates 'traditional' static IP and the larger superset of configurable IP. When generating design IP, the designer will generally not only include the basic information for using the component, but also plug-ins to various tools so that the end-user can use the IP more effectively. The designer of the IP does not want to write plug-ins for every platform the end-user might use to develop their IP (Windows, Unix etc). Therefore, Java's platform independence and 'run anywhere' code is advantageously employed by the invention for delivering IP plug-ins. The Java package model is also a good way of ensuring that component names do not clash as more third parties start developing IP for use with a given toolset.

The following examples of the XML format used in the exemplary embodiment are provided:

```
<com.arc.data.OptionDef_name_="entry" name="cache_bus_width" unit="bits"
valueValidScript="true" description="The Instruction Cache bus width">
        <java.lang.Integer_name_="defaultValue" value="24"/>
        <java.lang.String_name_="min"><![CDATA[19]]></java.lang.String>
        <java.lang.String_name_="max"><![CDATA[26]]></java.lang.String>
    </com.arc.data.OptionDef>
```

As can be seen in the above example, the XML refers to Java classes explicitly; i.e., 'com.arc.data.OptionInst' is a Java class. JavaScript can be embedded into the XML by saving it as Strings, as illustrated in the example below:

```
<com.arc.ipmodel.libraries.Variable_name_="entry" name="buildInformation">
        <java.lang.String_name_="script"><![CDATA[// Create a builder for this component.
var builder = new Packages.com.arc.tool.builder.AbstractBuilder(this);
// Generate a build information object with the vhdl file in from this component.
var info = builder.generateBuildInfo("VHDL_Child");
// Make the result of this variable equal to the build information object.
info;]]></java.lang.String>
        <java.lang.String_name_="description"/>
    </com.arc.ipmodel.libraries.Variable>
```

The Javascript can reference the XML by using the "dot operator" as previously referenced herein and described below.

The basic methodology for retrieving data using the dot operator is as follows. First, each path is always relative to something, usually a component instance. This gives the initial scope for looking up the data referred to by the path. The path is split into separate words, e.g. 'id.options.BusWidth' is split into 'id', 'options' and 'BusWidth'. The first part of the path (i.e. 'id') is examined and the current scope is requested to look up that object. In this case, requesting the component instance for 'id' returns an object which is used to look up instance data. Next, the instance data object that was returned is requested to provide the object, called 'options'. In this example, this involves loading an XML file off the hard drive, and returns a Java object which is the contents of the file.

Finally, the file contents object is queried for an object called 'BusWidth'. In this example, BusWidth is actually an OptionInstance.

If at any point of the lookup process the software finds an object that it doesn't know how to handle properly, then it searches for a plugin which tells it how to use the object. This makes use of the plugin framework described elsewhere herein.

By using the dot operator, the script can retrieve data out of the component; for example, 'id.options.cachewidth' would return the cache width out of the options file. In the embodiment where only type and instance data are specified, the first object must be either 'td' or 'id' to specify if the data should come from either the type data or the instance data.

IP Libraries and objects—Libraries can hold many different types of objects e.g. component types, link types, site types, templates etc. It is important that these objects have unique identifiers for the same reason that Java classes must be identified uniquely. In Java, a class can be identified precisely by using its full package path; e.g. 'com.arc.builder.filereader'.

Figure 30:
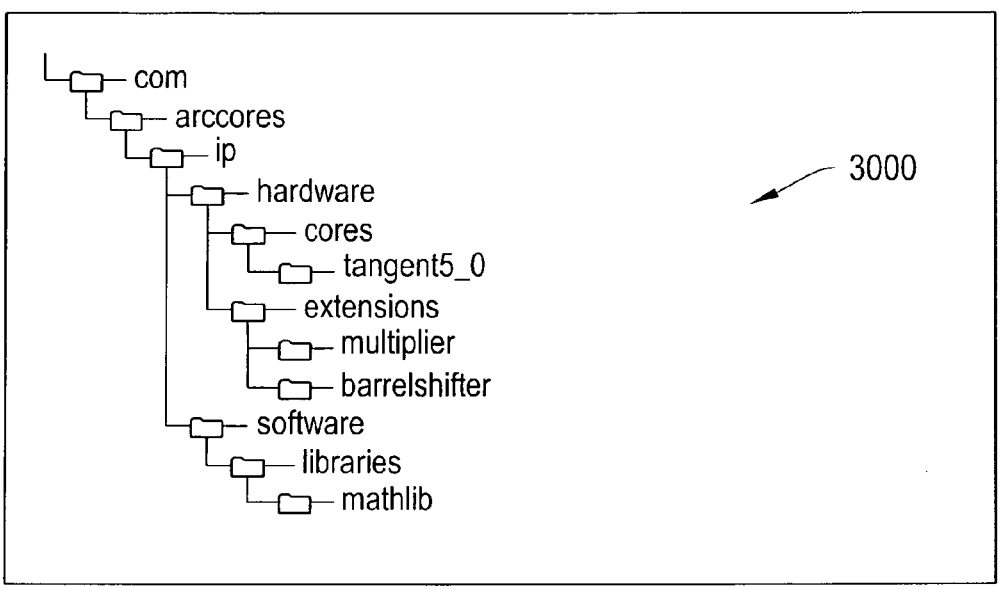
FIG. 30 illustrates examples of common objects and their resulting library structure according to the invention.

The same scheme is used in the present embodiment for finding objects in the various libraries. For example, a hardware component from a given company (e.g., ARC) may have the path:—'com.arc.ip.hardware.cores.tangent5_0'. Like the Java classes, the objects stored in the library are in package subdirectories. The following are examples of common objects and their resulting library structure:

com.arc.ip.hardware.cores.tangent5_0
    com.arc.ip.hardware.extensions.multiplier
    com.arc.ip.hardware.extensions.barrel shifter
    com.arc.ip.software.libraries.mathlib See the directory structure 3000 of FIG. 30. Like Java packages, the top-level package names should employ a conflict-free naming technique (e.g., the reversed company URL minus the 'www'). After that, the other package names can be chosen by the developer of the IP.

Java classes will often be delivered as part of an IP component. To do this, the IP developer would ship one or more class files with the component as part of the tool data (tool data is explained in detail subsequently herein). To illustrate the java class as part of the component, the following example of inserting a class file into an exemplary ARCtangent processor is used.

Figure 31:
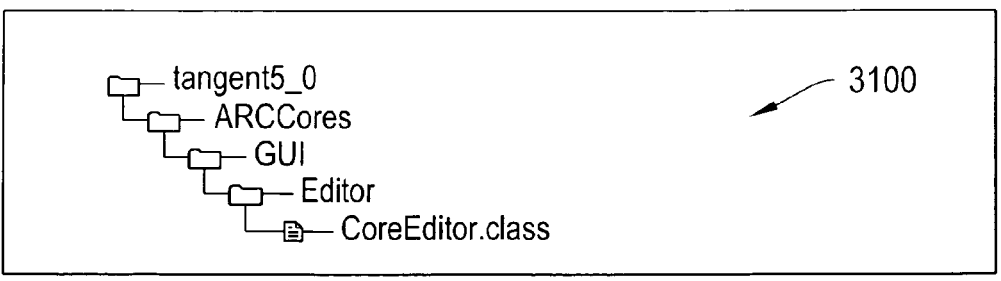
FIG. 31 illustrates the directory structure of the IP of an exemplary ARCtangent core.
Figure 32:
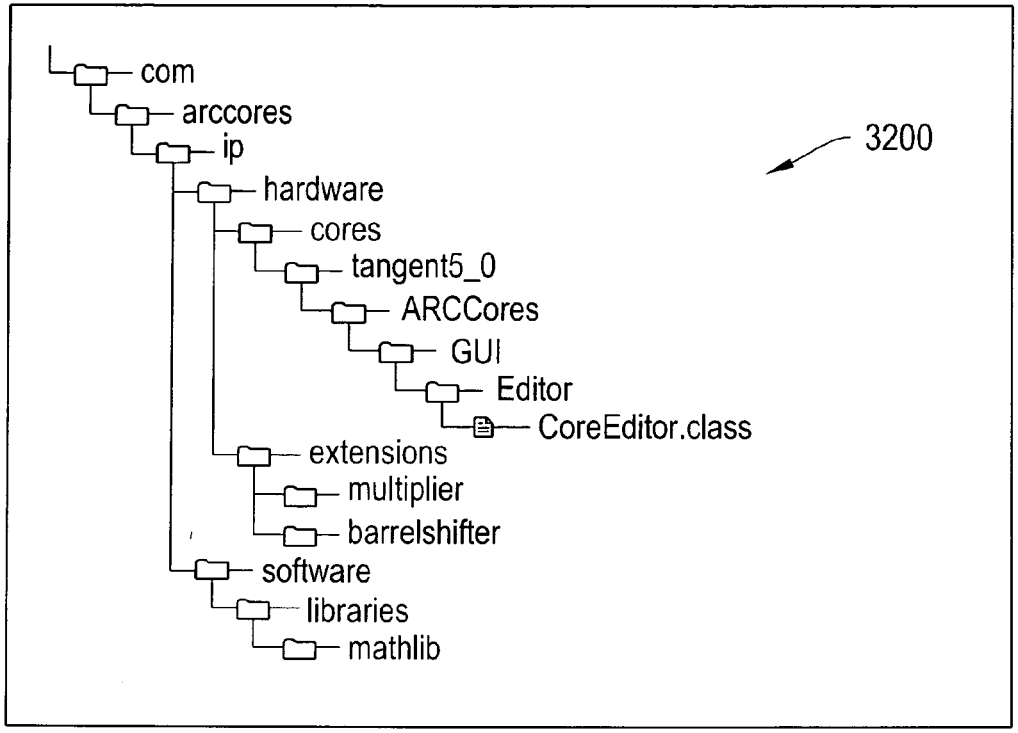
FIG. 32 illustrates an exemplary directory structure associated with the core of FIG. 30.

FIG. 31 illustrates the directory structure 3100 of the exemplary ARCtangent Core IP. As can be seen, the CoreEditor.class file is stored in a subdirectory under the tangent5_0 component. Now, if this file is placed into the library, the directory structure 3200 of FIG. 32 results. By making the library part of the Java classpath, the class can be accessed by using the following path:

com.arc.ip.hardware.cores.tangent5_0.arc.gui.editor.
        CoreEditor

Tool Data And Instance Data

The information stored in the IP libraries and IP projects of the illustrated exemplary embodiment of the invention is split into two types of data: (i) tool data, which is stored in a component, link and site types to tell the tools how to deal with these components; and (ii) instance data, which is stored in the components, links and sites in IP projects, and is information which is only relevant to that instance of the component.

(i) Tool Data—Tool data comprises information which tells the tools about a particular component, site or link type is tool data. So, for example, the tools may want to find out information relating to the following:

1) how to build a given component;
2) what warning messages apply to a component, and when they should be displayed;
3) how the user can connect this component to other components;
4) what options the user can choose for this component, e.g. the current ARC core has options for the cache size, bus width, etc.;
5) how the compiler identifies instructions that this component adds to the core; and
6) interrupts used by the component.

(ii) Instance Data—Anything that differentiates a component instance from another is instance data. For example, the tools should to obtain information regarding the following:

1) the options the user has chosen for the given component;
2) the location of the profiling data for the core; and
3) the placement of the component on the screen by the user.

An important part of the way tool data and instance data is stored is the way it in which it is addressed. For example, the tool data for a particular component type could be in the form of several megabytes (Mb) of files. These files would generally be arranged into a logical directory structure. In one exemplary embodiment, the way in which the directories are structured is similar to the way in which Java packages are arranged. All tool data is stored in the component subdirectory in the library. It will be recognized, however, that other structures may be utilized consistent with the invention.

The instance data of the present embodiment is also stored in a similar directory structure. However, it is stored in the '_data_' subdirectory under the component instance directory.

Figure 33:
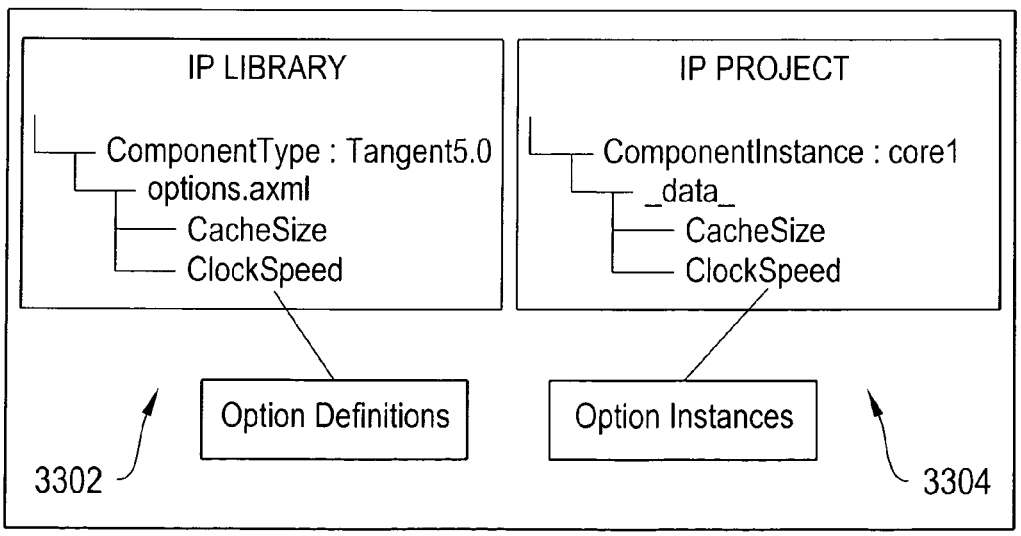
FIG. 33 illustrates the directory structures for the component type and the component instance of the exemplary project.

Based on the foregoing, the directory structures 3302, 3304 for the component type and the component instance are as shown in FIG. 33.

When the tools look up the tool data from the library, they use the full path to address the data. In addition, like Java, the path uses a '.' instead of a '/' or '\'. In addition, the first part of the path must be either 'id' (for instance data) or 'td' (for tool data) when these two classifications are specified. For example, to address the definition of an option called 'CacheSize' in a component type, the path may be as follows:

td.options.CacheSize

Note, that in this example, 'options' is a file, and 'CacheSize' is an XML element within that file. Given this information, the tool knows about the option definition; i.e. what type it is, what range of values it can take, etc. Now, the actual value the user has chosen for a particular instance of the component is determined. To do this, the option instance data is utilized. When the tools look up the various pieces of instance data from the projects, they use the full path to address the data (except the '_data_' directory is omitted and a '.' is used in place of the '\' or '/'). Therefore, the full path for the variable instance 'CacheSize' might be as follows:

id.options.CacheSize.

Using Instance Data in Tool Data—the present invention, tool data frequently refers to the instance data. For example, an error message may only be displayed if the user has chosen certain options for the component. So the tool data may look something like the following:

Message:
"Cache size cannot be greater than 16K with a bus width greater than 24"

Condition:
id.options.CacheSize>16000 && id.options.BusWidth>24

The condition expression shown above is clearly part of the message tool data, but the script interpreter must know the current cache size and bus width. The cache size and bus width are instance data, and are therefore stored in the component instance. Note how the script uses the fully qualified paths to the options. This allows the script interpreter to search through the directory structure for the needed files, and then to look up the correct XML element within that file.

Variables in Sites—Components exchange information across sites using variables. Variables are in one embodiment embodied as pieces of script which are executed to return a Java object to the caller. For example, a chip object may have a 'Clock' option that is used to set the clock speed of the chip. However, this clock speed must be propagated to all components in the chip so that they know how fast they are running. To inform the other components about the clock speed, there must be a clock link type and sites on the components to link them.

Figure 34:
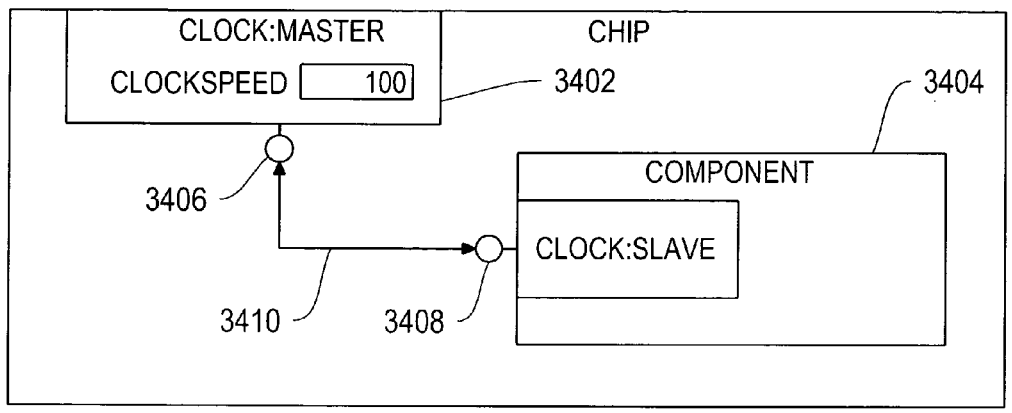
FIG. 34 is a block diagram illustrating two exemplary design components, their sites and the link that joins them.

For a simple clock link type two site types are needed; a master and a slave. The clock master site type specifies that the component it is placed on must provide a clock speed. Similarly, the clock slave site type specifies that the component will receive a clock speed. When the clock master site is placed on the chip, the designer will be informed that they need to provide a clock speed via the new site. FIG. 34 shows these two exemplary components 3402. 3404, their sites 3406, 3408 and the link that joins them 3410.

Now, consider a piece of tool data in the slave component e.g. a warning message. Like other tool data, it will reference instance data such as variable instances, etc.

Message:
"Cache size cannot be greater than 32K with a chip clock speed greater than 200 MHz"

Condition:
id.options.CacheSize>32000 && Clock[0].ClockSpeed>200

By putting the name of the 'Clock' site before the variable, the API knows to get the clock speed from the chip's master site.

All variables are associated with either the component or one of its sites. To accomplish this, variables are stored in files in the 'variables' directory of the component type. For each site there is an "axml" file of the same name with the variables available from that site. In addition, there is also a 'self.axml' file with variables which belong the component only.

Scripting In The IP Library

XML is a format designed for expressing data structures; it is not a programming language. There are several pieces of information that need to be expressed in the component type definitions that do not lend themselves to a data driven approach. It is relatively common to extend XML's functionality with scripting languages since they are interpreted at run time, and the code can be placed directly inside the XML as text.

Tool Data—Some tool data benefits from expression evaluation. For example, consider a piece of tool data that stores information about the number of gates a particular component uses. This information can vary depending on the options the user has chosen. For example, the number of gates used by a barrel shifter depends on whether the user has selected fast or small (with more complex objects, the number of gates could be a product of several variable values). For example, the barrel shifter gate information may need to be calculated as follows:

if (id.arc.variables.FastOrSmall=="Small")

1234;

else

5678;

However, a more complex example would be the number of gates used by the core. This value would require a calculation based on many attributes. For example, it would need to take into account the 'Register File RAM', the 'Cache Type', 'Cache Size', 'Memory Subsystem', etc.

Consider also what happens when a piece of functionality is replaced using a replacement site. For example, if the instruction cache can be replaced by another cache component, then the number of gates used by the core will decrease, and the new component will add its own number of gates to the total. Therefore, the gate count calculation for the core would have to know if the default cache was being used. For this to happen, the calculation would have to take into account whether the cache override site had been used. Consider the following example:

. . .

[Other calculations here]

. . .

if (CacheOverride.isConnected==false)

Figure 35:
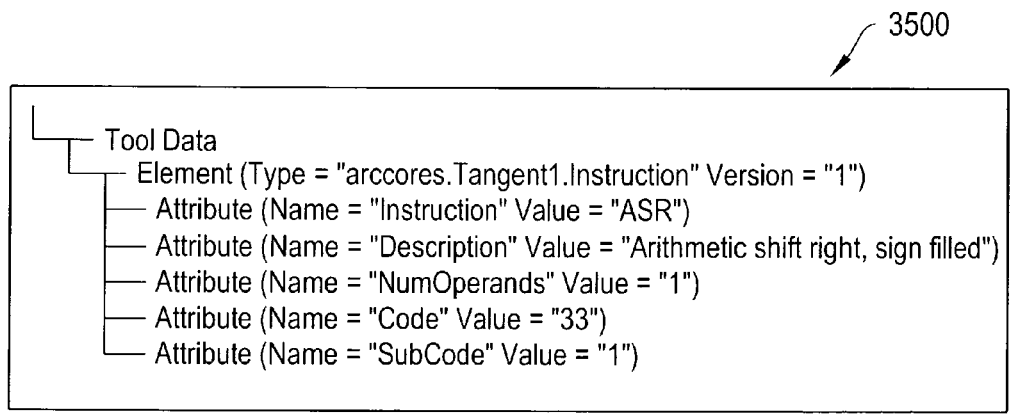
FIG. 35 illustrates the use of tool data for an interface, the tool data having a fixed attribute value.
Figure 36:
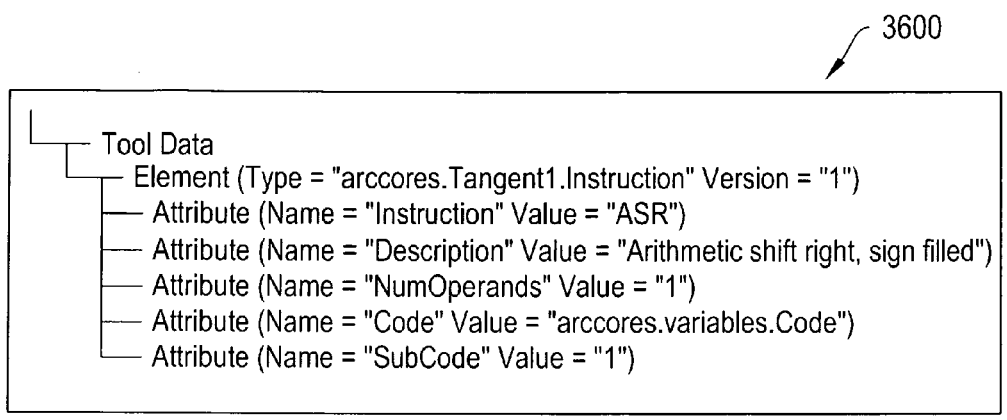
FIG. 36 illustrates exemplary tool data utilizing scripting in place of fixed attribute values.

NumberOfGates+=1234;

Another use of scripting in the tool data is to put variable values into the data that drives the tools. For example, consider an extension to the core that adds a new instruction. In one arrangement, each extension instruction has a predefined code number that is set when the component is created. The tool data for the interface is used to give that information 3500 to the various tools, as shown in FIG. 35. However, the code number can be a variable of the instruction link type. This enables the user to choose what code they want to use for the new instruction. The tool data for the link type includes a 'com.arc.ARCtangent1.Instruction', but without a fixed value for the code. Instead, a piece of script 3600 is used, as shown in FIG. 36. In the tool data shown in FIG. 36, the code number is no longer "33" as in FIG. 35, but instead, a piece of script that evaluates to an integer. So, when the user changes the code from the software, the change advantageously ripples through the tool chain to the compiler, debugger, etc.

Scripting Language—In one embodiment, the present invention employs ECMA script as a scripting language, although it will be recognized that other languages may be substituted with success. This language is based on JavaScript (Netscape) and Jscript (Microsoft), and was originally designed to create dynamic web pages. The language was standardised by the European Computer Manufacturers Association as ECMA script, and has become the official scripting language for HTML (HTML is a subset of XML). ECMA script has a syntax similar to Java/C/C++ and is based on the principal of the host application providing objects which the script then manipulates. Having a C-like syntax advantageously infers that many engineers will find it familiar. It includes functions, while loops, for loops, if/else statements, as well as conventional numerical operators (+, −, *, /, &, |, >>, << etc.). It provides core objects for mathematical functions (sin, cos, log etc.) and string manipulation.

The exemplary code of the present invention includes a full JavaScript (ECMA) interpreter that evaluates code embedded in the tool data. It is also possible for applications to user the interpreter for their own needs e.g. user interface scripting, test scripts.

For the scripts to work as desired, they require access to various pieces of information. The primary information required includes the following:
 1. The various pieces of instance and tool data of the component.
 2. How the component is connected to other components (via links).
 3. Variables from connected components.

Each piece of script executes inside a context that holds all the Javascript variables that the script can read and write. In the component object model these Javascript variables hold the information about the instance data and links. The following objects are in a component's context:
 It can see all instance data of the current component.
 It can see all the tool data of the current component's type.
 It can see all variables sites of the current component.
 It can see all variables of the other ends of all links.

Figure 37:
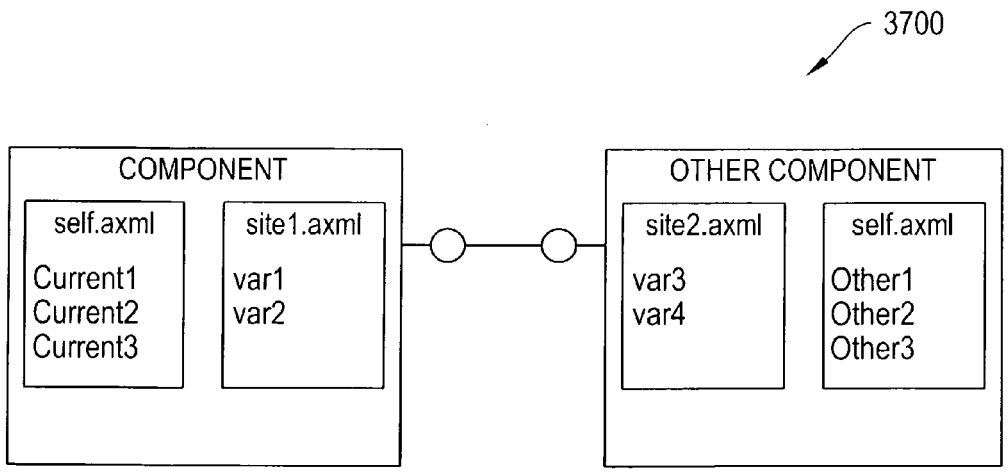
FIG. 37 is a graphical representation of an exemplary component context and its relationship to another component.

This is illustrated graphically in the relationship 3700 of FIG. 37.

If the script being executed is in 'Component', then it would be able to 'see' the following variables:
 Current1, Current2 and Current3:—They belong to the same component as the script.
 Var1 and Var2:—They belong to a site of the component.
 Var3 and Var4:—They belong to a site at the other end of a link.

However, it would not be able to 'see' Other1, Other2 and Other3 as these are out of scope.

Sites—As with instance data, the script can obtain information about a site. For each site, there is an object in the context of the same name. That object has various member variables that the script can read. The members are as follows:
 1) numLinks:—The number of links joined to this site.
 2) [n]:—Gets the nth link connected to this site.

The following examples illustrate these concepts.

EXAMPLE 1

The following code shows how a cache component would find information relating to the core it is attached to:

```
if (CoreSite.numLinks>0)
{
    // Check to make sure our bus width is >= to the core's
    if (id.options.CacheAddressBusWidth >=
        CoreSite.[0].MemoryBusWidth)){
        return true;
    }
```

-continued

```
    return false;
}
```

EXAMPLE 2

This next example illustrates how this approach can be used to define very complex relationships. In this example, the core component has a link site called 'Signal'. All components that plug into this link site add a delay to the signal. The core must verify that the total delay of all components is less than 1.0. The delay would be a variable of the extension role of the signal link type.

The core component may also have a warning message to tell the user if the delay is over one. This warning has an associated piece of script that is evaluated to see if the warning is valid or not. The following is exemplary script:
 //This will store the total delay.

```
var Delay = 0.0;
// Get the number of links to the signal interface
var numLinks = Signal.numLinks;
for (Link=0;Link<numLinks;Link++)
{
    // Add the delay of the extension to the total.
    Delay += Signal[Link].Delay);
}
// If total delay is less than 1, then warning is not shown.
if (Delay < 1.0)
    false;
else
    // Total delay must be >=1, so show warning.
    true;
```

As can be seen, the script iterates through all the connected components, and adds their Delay value to the total. This total is then compared to 1.0 to determine its validity.

EXAMPLE 3

In a prior example, where the user can choose the op-codes used by the various extension instructions, there would likely be a warning message if two extensions try to use the same op-code. This warning message can be implemented with a piece of script that is evaluated to see if the warning is valid or not. The script may be configured as in the following exemplar:

```
// Allocate an array to hold the used code numbers.
var Opcodes = new Array( );
// Get the number of links to the instruction interface
var numLinks = InstructionLinkSite.numLinks;
// Holds the result of this script.
var result = false;
for (Link=0;Link<numLinks;Link++)
{
    var code = InstructionLinkSite.[Link].Code;
    // See if the code is already used.
    if (Opcodes[code] == true){
        // Opcode is already used, so display warning.
        result = true;
        break;
    }
    // Mark it as used in the array.
    Opcodes[code] = true;
```

-continued

```
}
// Return the result.
result;
```

This code allocates an array, and for each instruction extension connected to the core, it sets the array location given by the code number to "true." If any extension tries to use a code number that is already used, then that array entry will already be set true, and the warning is shown.

Tree Management—The present invention also provides for enhanced tree management. This functionality is based on the plugin framework mentioned earlier. When a tool comes across a piece of data that it does not know how to insert into a tree, it searches for a plugin which instructs it in this regard. For example, if a third party developer wants to add information about what include files need to be added to a C file, then this information may be in the form of a list of file names. Assuming that the tool does not know how to show this information in a tree, the developer can write a Treeable Provider for their data which will tell the tool how to add it to a tree. The information that the tool needs to know includes information such as the number of children, which icon should be displayed, etc. The advantages of this approach are that the software can be extended by third party developers or end-users without input from the primary developer. This allows other entities who want to add their own data to the components to include support for the IP on their own accord.

Tool extensibility—As previously referenced, the present invention utilizes extensible tools based on Java's reflection mechanism to find classes at runtime. This allows the end-user to add their own classes to the application without the need for additional modification by the primary designer. These may include plugins for loading and viewing different file types, plugins for customizing the library and project trees, plugins for viewing different types of data stored in the component, etc. For example, if a third party wanted to add files to the library which contain their own proprietary data format, then they can create a plugin for loading that data into the software, and viewing it within the GUI. This is accomplished in the exemplary embodiment by placing Java class or Jar files into a directory on the storage device (e.g., system hard drive) which are analyzed at startup to locate the plugins.

Plugins can be added to the tool simply by placing Java classes in the correct directory. The tool then examines the classes using Java reflection to find out what capabilities they have. The plugins can then perform their task automatically. For example, a plugin could serialize a class, or provide an editor for a new piece of data.

HTML documentation generation—In yet another aspect of the invention, the exemplary application automatically generates documentation for the specific Project configuration the user has selected. Various aspects are documented in the custom HTML user documentation. The information included is built dynamically from the data within the component definition but configured by the options within the component instance, which indicates it is essential to build a custom documentation set specific to a project. For example, if Multiplier is included in the design—the Instruction Set documentation will include the instructions added by this extension and the gate count will display the gates taken up by the component. Configure the Multiplier options to set the Multiplier to the small implementation and the Gate Count will decrease for the component. This information needs to be reflected in the custom HTML documentation.

In generating the HTML documentation, data is drawn from all components included in a project, in most cases these are hardware components—but in practice it can be applied to the software paradigm. The data is collated, formatted, and output as HTML in a tabular format readable by the user. Examples of the generated tables for a hardware project are that of a Design Summary, Interrupts, Register Set, Instruction Set and Gate Counts.

Build Sequencer—In the exemplary embodiment of the invention, the process of building the design is handled by a build sequencer. This has a separate 'sequence' for each atomic step in the build process allowing the user much more control that prior art approaches. An example would be that the user could decide to just recompile the test code and rerun the verification tests, without rebuilding the HDL or compilation scripts, saving a lot of time when developing new components. The sequencer is controlled by options set by the user; they decide which steps in the sequence to execute for example by setting the values to true or false.

Each sequence step is essentially a section of JavaScript that has access to instance and tool data from the Project and IP Library. Some additional functionality is provided in the form of pre-defined JavaScript for performing common actions like running command line applications, logging messages to the output window, and file handling. The user is also free to add to the framework of these pre-defined scripts as they are all stored in the IP Library itself.

Topology Display—The exemplary embodiment of the present invention further includes a "topology view" adapted for viewing graphical representations on the users design. Topology Data is stored in each component giving details of how components should be displayed when included in a design, whether it should be grouped with other components or represented on its own. The topology view then automatically handles drawing, grouping and displaying graphically, specific link information. It also provides a point and click interface for selecting components so that you can change their option values and delete them from the design. In conjunction with the component viewer, which displays all the available components in the current IP Library, it also provides drag and drop functionality for adding components to the current Project.

Using data provided by the components it also gives the user feedback about the number of each type of component allowed in any particular design, preventing the user from creating a illegal combination of components, e.g. having more than one instruction cache connected to a single core.

Appendix I hereto provides exemplary code used in implementing this topology functionality.

Integrated Circuit (IC) Device

As previously described, the Assignee's ARCtangent processor core configuration is used as the basis for the IC device of the exemplary embodiments described herein; however, other arrangements and configurations may be substituted if desired. The device is fabricated using the customized VHDL design obtained using the method referenced subsequently herein, which is then synthesized into a logic level representation, and then reduced to a physical device using compilation, layout and fabrication techniques well known in the semiconductor arts. For example, the present invention is compatible with 0.35, 0.18, and 0.1 micron processes, and ultimately may be applied to processes of even smaller or other resolution. An exemplary process for fabrication of the device is the 0.1 micron "Blue Logic" Cu-11 process offered by International Business Machines Corporation, although others may be used.

It will be recognized by one skilled in the art that the IC device of the present invention may also contain any commonly available peripheral such as serial communications devices, parallel ports, timers, counters, high current drivers, analog to digital (A/D) converters, digital to analog converters (D/A), interrupt processors, LCD drivers, memories and other similar devices. Further, the processor may also include other custom or application specific circuitry, such as to form a system on a chip (SoC) device useful for providing a number of different functionalities in a single package as previously referenced herein. The present invention is not limited to the type, number or complexity of peripherals and other circuitry that may be combined using the method and apparatus. Rather, any limitations are primarily imposed by the physical capacity of the extant semiconductor processes which improve over time. Therefore it is anticipated that the complexity and degree of integration possible employing the present invention will further increase as semiconductor processes improve.

It can be appreciated that while certain aspects of the invention have been described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

We claim:

1. A computerized system for generating user-configured designs of integrated circuits, comprising:
   a user interface adapted to provide and receive information to and from a user, respectively; and
   an object-oriented design environment operatively coupled to said user interface and having a plurality of associated design tools, wherein a plurality of components associated with said designs of integrated circuits are represented as objects, at least a portion of said objects being encapsulated and containing information relating to both the interface and build hierarchy associated with its respective design component, said design tools using said information within said objects to build said design, said objects being user-configurable and selectable within said environment via said user interface;
   wherein said objects being user configurable comprises adding an extension instruction to said designs of integrated circuits, said extension instruction comprising a mixed length instruction set architecture that utilizes instructions of at least two lengths without a mode switch.

2. The system of claim 1, wherein said information comprises a maximum memory bus width.

3. The system of claim 1, wherein said information comprises at least one Java script.

4. The system of claim 1, wherein said plurality of components comprise a processor core and an extension instruction, said information comprising HDL that must be added to HDL associated with said core for said extension.

5. The system of claim 1, wherein said information comprises a script which is evaluated at runtime to retrieve said interfaces and said build hierarchy.

\* \* \* \* \*